(12) United States Patent
Shinohara

(10) Patent No.: US 11,792,548 B2
(45) Date of Patent: Oct. 17, 2023

(54) PHOTOELECTRIC CONVERSION DEVICE, PHOTOELECTRIC CONVERSION SYSTEM, AND MOVING BODY

(71) Applicant: CANON KABUSHIKI KAISHA, Tokyo (JP)

(72) Inventor: Mahito Shinohara, Tokyo (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 18/156,046

(22) Filed: Jan. 18, 2023

(65) Prior Publication Data

US 2023/0156365 A1 May 18, 2023

Related U.S. Application Data

(63) Continuation of application No. 16/817,017, filed on Mar. 12, 2020, now Pat. No. 11,588,995.

(30) Foreign Application Priority Data

Mar. 22, 2019 (JP) .................. 2019-055666

(51) Int. Cl.
*H04N 25/75* (2023.01)
*H01L 27/146* (2006.01)
*H01L 31/107* (2006.01)
*H01L 31/02* (2006.01)
(Continued)

(52) U.S. Cl.
CPC ....... *H04N 25/75* (2023.01); *H01L 27/14612* (2013.01); *H01L 27/14643* (2013.01); *H01L 31/02027* (2013.01); *H01L 31/107* (2013.01); *H04N 25/62* (2023.01); *H04N 25/76* (2023.01)

(58) Field of Classification Search
CPC ........ H04N 25/75; H04N 25/62; H04N 25/76; H01L 27/14612; H01L 27/14643; H01L 31/02027; H01L 31/107
See application file for complete search history.

(56) References Cited

U.S. PATENT DOCUMENTS 10,254,389 B2 * 4/2019 Na .................. G01S 7/4863
10,770,504 B2 * 9/2020 Na .................. H01L 31/11
10,886,311 B2 * 1/2021 Chen ............... H01L 27/14641
(Continued)

FOREIGN PATENT DOCUMENTS

JP 2007-266556 A 10/2007
JP 2008-99174 A 4/2008
(Continued)

*Primary Examiner* — Abdelaaziz Tissire
(74) *Attorney, Agent, or Firm* — Canon U.S.A., Inc. IP Division

(57) ABSTRACT

A photoelectric conversion device includes a photoelectric conversion region, a readout circuit, and a counting circuit. The photoelectric conversion region is configured to generate a signal charge. The readout circuit is configured to, when reading out a signal that is based on the signal charge generated at the photoelectric conversion region, selectively perform first readout for reading out the signal using avalanche multiplication that is based on the signal charge and second readout for reading out the signal without causing avalanche multiplication to occur with respect to at least a part of the signal charge. The counting circuit is configured to count a number of occurrences of avalanche current which is caused to occur by avalanche multiplication in the first readout.

22 Claims, 24 Drawing Sheets

(51) Int. Cl.
*H04N 25/62* (2023.01)
*H04N 25/76* (2023.01)

(56) References Cited

U.S. PATENT DOCUMENTS

| | | | | |
|---|---|---|---|---|
| 10,978,503 | B2* | 4/2021 | Shinohara | H01L 31/11 |
| 11,588,995 | B2* | 2/2023 | Shinohara | H01L 27/14641 |
| 2009/0184384 | A1* | 7/2009 | Sanfilippo | H01L 27/14629 |
| | | | | 257/E31.119 |
| 2015/0281620 | A1* | 10/2015 | Usuda | H01L 27/14609 |
| | | | | 257/438 |
| 2017/0131143 | A1* | 5/2017 | Andreou | H01L 31/035272 |
| 2017/0257586 | A1* | 9/2017 | Kato | H04N 23/959 |
| 2018/0108800 | A1* | 4/2018 | Morimoto | H01L 31/03529 |
| 2019/0020836 | A1* | 1/2019 | Kasuga | H04N 25/771 |

FOREIGN PATENT DOCUMENTS

| | | |
|---|---|---|
| JP | 2013-090139 A | 5/2013 |
| JP | 2018-160667 A | 10/2018 |

* cited by examiner

FIG.7

$S1 \geq S0$   YES $\Rightarrow$ PIXEL SIGNAL = S1 + S2

NO $\Rightarrow$ PIXEL SIGNAL = S1

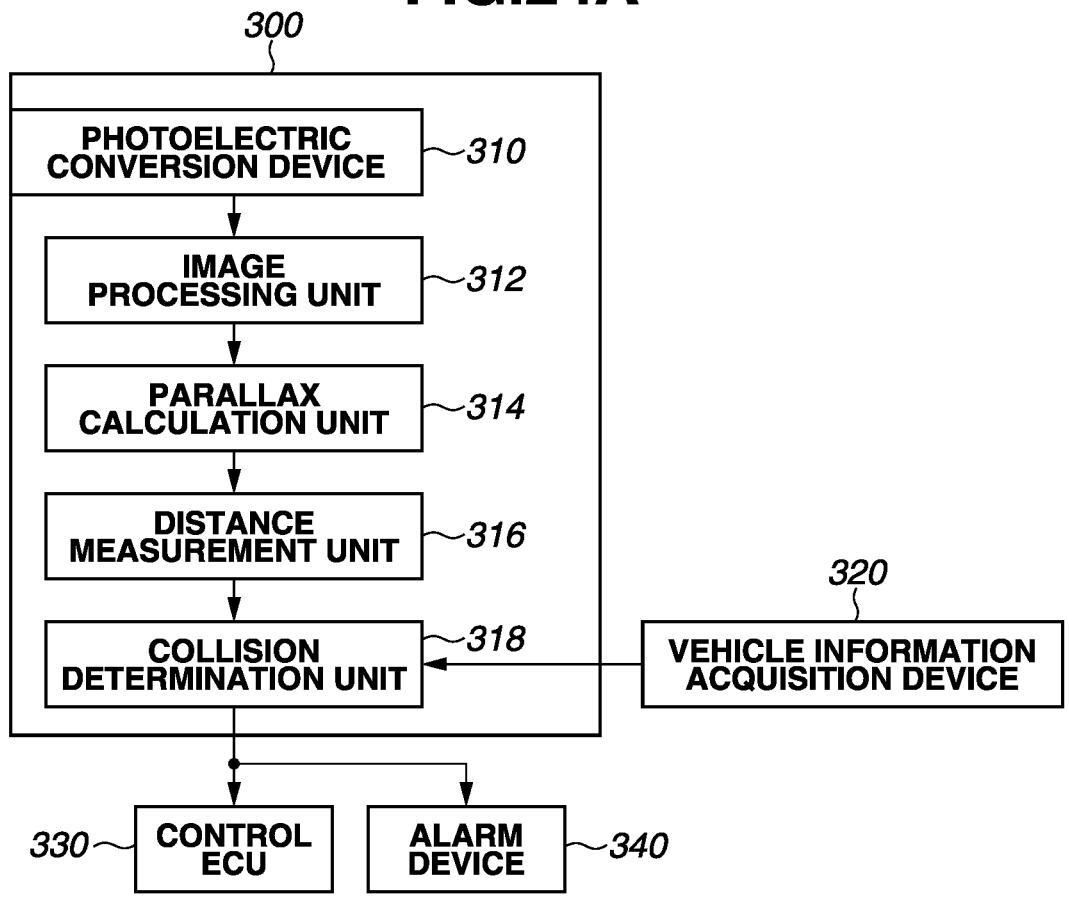
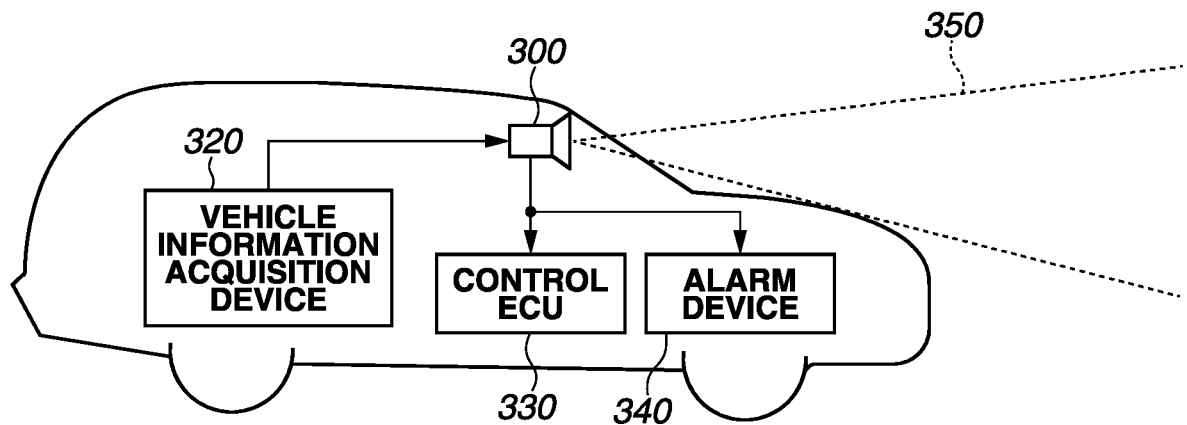

PHOTOELECTRIC CONVERSION DEVICE, PHOTOELECTRIC CONVERSION SYSTEM, AND MOVING BODY

CROSS-REFERENCE TO RELATED APPLICATION

This application is a Continuation of U.S. application Ser. No. 16/817017, filed Mar. 12, 2020, which claims priority from Japanese Patent Application No. 2019-055666, filed Mar. 22, 2019, which is hereby incorporated by reference herein in its entirety.

BACKGROUND

Field

Aspects of the present disclosure relate to a photoelectric conversion device.

Description of the Related Art

Japanese Patent Application Laid-Open No. 2007-266556 discusses a photoelectric conversion device including high-sensitivity pixels configured to read out signals therefrom using avalanche multiplication (avalanche breakdown) and low-sensitivity pixels configured to read out signals therefrom without causing avalanche multiplication to occur. In the photoelectric conversion device discussed in Japanese Patent Application Laid-Open No. 2007-266556, a photoelectric conversion region is provided for every pixel. Then, operations of the photoelectric conversion device include an operation of outputting a composite signal obtained by combining a signal acquired from a signal charge generated at a photoelectric conversion region provided as a low-sensitivity pixel and a signal acquired from a signal charge generated at a photoelectric conversion region provided as a high-sensitivity pixel.

The photoelectric conversion device discussed in Japanese Patent Application Laid-Open No. 2007-266556 has the space to be able to improve image quality. As mentioned above, in the photoelectric conversion device discussed in Japanese Patent Application Laid-Open No. 2007-266556, photoelectric conversion regions each provided as a high-sensitivity pixel and photoelectric conversion regions each provided as a low-sensitivity pixel are separately arranged. Then, a signal charge with more than a predetermined amount out of signal charges generated at high-sensitivity pixels is not able to be read out and is discarded. Thus, the quantity of signals able to be acquired from the high-sensitivity pixels decreases. In particular, in a case where a certain amount of light is radiated onto high-sensitivity pixels, since signal charges to be discarded increase, a decrease in the quantity of signals which are acquired from the high-sensitivity pixels becomes conspicuous. As a result, such a conventional photoelectric conversion device has the possibility of bring about a decrease in image quality.

SUMMARY

According to an aspect of the present disclosure, a photoelectric conversion device includes a photoelectric conversion region, a readout circuit, and a counting circuit. The photoelectric conversion region is configured to generate a signal charge. The readout circuit is configured to, when reading out a signal that is based on the signal charge generated at the photoelectric conversion region, selectively perform first readout for reading out the signal using avalanche multiplication that is based on the signal charge and second readout for reading out the signal without causing avalanche multiplication to occur with respect to at least a part of the signal charge. The counting circuit is configured to count a number of occurrences of avalanche current which is caused to occur by avalanche multiplication in the first readout.

According to another aspect of the present disclosure, a photoelectric conversion device includes a first semiconductor region, a third semiconductor region, a fourth semiconductor region, a first readout path, and a second readout path. The first semiconductor region has a first conductivity type in which carriers having a first polarity that is the same polarity as that of the signal charge are set as a majority carrier and accumulating the signal charge generated by photoelectric conversion. The third semiconductor region is of the first conductivity type. The fourth semiconductor region is of the first conductivity type. The first readout path is configured to transfer at least a portion of the signal charge from the first semiconductor region to the third semiconductor region and read out the transferred at least a portion of the signal charge using avalanche multiplication. The second readout path is configured to transfer at least a portion of the signal charge from the first semiconductor region to the fourth semiconductor region and read out the transferred at least a portion of the signal charge without causing avalanche multiplication to occur with respect to the signal charge.

Further features of the present disclosure will become apparent from the following description of exemplary embodiments with reference to the attached drawings.

BRIEF DESCRIPTION OF THE DRAWINGS

FIG. 7 is an algorithm diagram for pixel signal composition in the first exemplary embodiment.

FIGS. 24A and 24B are diagrams illustrating configuration examples of a photoelectric conversion system and a moving body, respectively, in a sixth exemplary embodiment.

DESCRIPTION OF THE EMBODIMENTS

Figure 1:
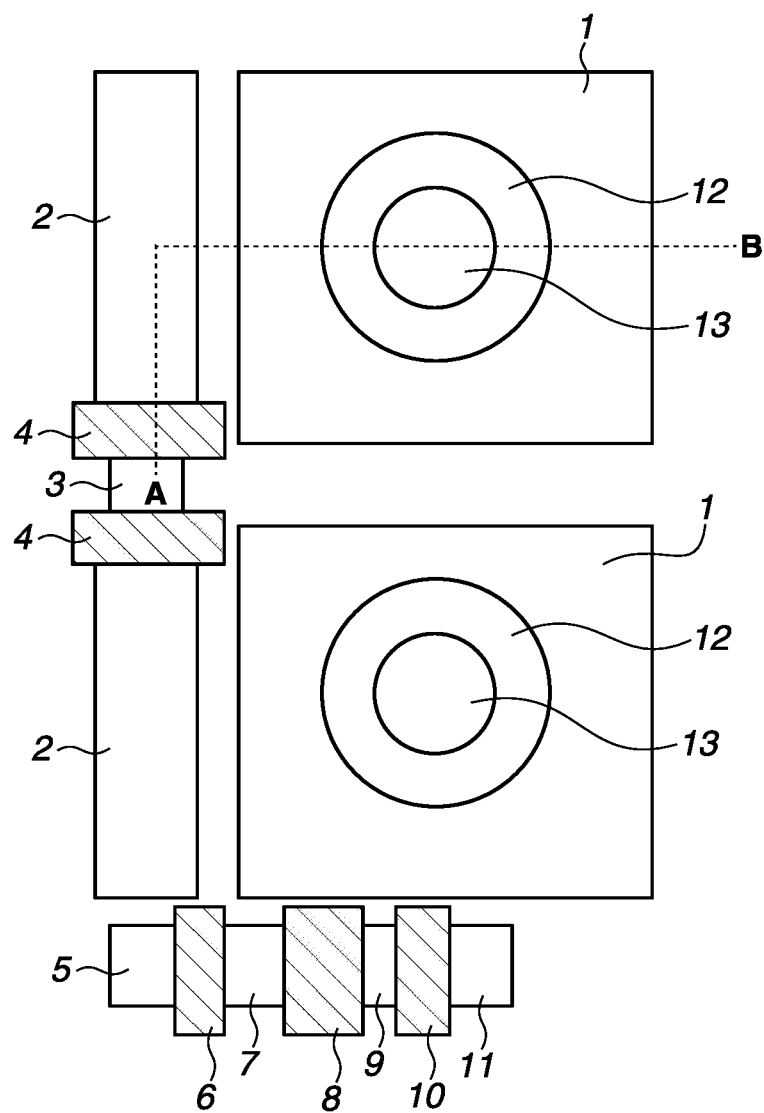
FIG. 1 is a planar layout diagram of pixels in a first exemplary embodiment.

Exemplary embodiments described below are merely specific examples of the technical idea of the disclosure and should not be construed to limit the disclosure. Furthermore, the size or positional relationship of each member illustrated in each drawing may be exaggeratingly drawn for clarity of explanation. In the following description, the same constituent elements are assigned the respective same reference numerals and are not repeated.

In the following description, a signal carrier (signal charge) is assumed to be an electron. A semiconductor region of a first conductivity type in which carriers having a first polarity are set as a majority carrier is an N-type semiconductor region, and a semiconductor region of a second conductivity type in which carriers of a second polarity are set as a majority carrier is a P-type semiconductor region. Therefore, a signal charge accumulation region of a photodiode (hereinafter referred to as a "PD") is an N-type semiconductor region, and a metal-oxide semiconductor (MOS) transistor of a pixel is of the N type. Naturally, the disclosure can also apply to a case where a signal carrier is a hole and the polarities of the P type and the N type are reversed.

Figure 8:
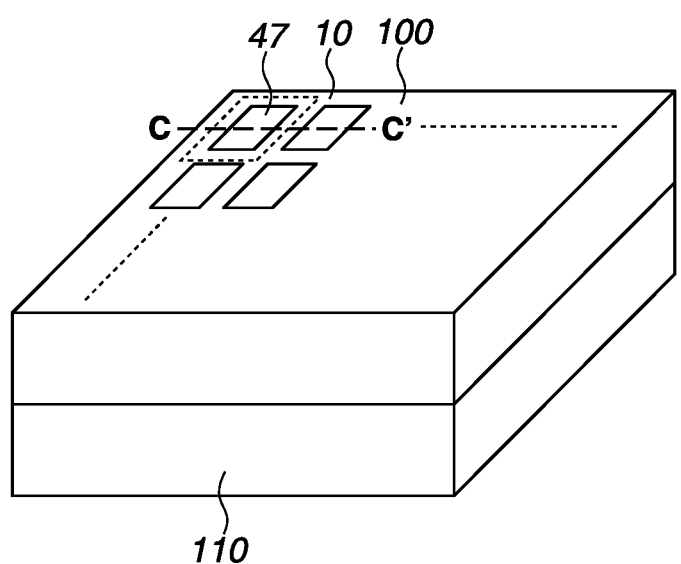
FIG. 8 is a schematic view of a photoelectric conversion device in the first exemplary embodiment.

As illustrated in FIG. 8, a photoelectric conversion device in each exemplary embodiment described below includes pixels 47 arranged in a two-dimensional manner. The photoelectric conversion device has a structure in which a first semiconductor substrate 100, in which a photoelectric conversion region of each pixel 47 is formed, and a second semiconductor substrate 110, in which a readout circuit for the pixels 47 is formed, are stacked in layers. Moreover, the photoelectric conversion device has what is called a backside incidence type structure in which a wiring layer is formed between the first semiconductor substrate 100 and the second semiconductor substrate 110 and light is made incident from a side opposite to the side of the first semiconductor substrate 100 on which the wiring layer is provided. However, naturally, the disclosure is not limited to such a structure. For example, the first semiconductor substrate 100 can contain photoelectric conversion regions of the pixels 47 and the readout circuit.

In the following exemplary embodiments, in a semiconductor substrate, a surface on the side on which the wiring layer is formed is referred to as a "front surface", and a surface on a side opposite to the side on which the wiring layer is formed is referred to as a "back surface".

FIG. 1, which represents a first exemplary embodiment, is a planar layout diagram of pixels obtained when the first semiconductor substrate 100 is viewed from the front surface side on which the second semiconductor substrate 110 is arranged. In FIG. 1, two pixels are illustrated, and there are constituent elements included in the respective pixels and constituent elements shared by the two pixels.

In FIG. 1, each pixel individually includes a photodiode (hereinafter referred to as a "PD") 1, which receives incident light and accumulates signal electrons generated by reception of the light, a charge accumulation region 2, which receives and accumulates signal electrons which have not finished being accumulated and have overflowed, and an avalanche diode 12. The PD 1, the avalanche diode 12, and a cathode 13 of the avalanche diode 12 are arranged in the semiconductor substrate 100 in such a way as to overlap each other in planar view. The charge accumulation region 2 is formed with an N-type semiconductor region. Then, two pixels share a floating diffusion (hereinafter referred to as an "FD") 3, to which electrons accumulated in the charge accumulation region 2 of each pixel are transferred. Each pixel further includes a transfer gate 4, which is configured to transfer electrons accumulated in the charge accumulation region 2 to the FD 3. Moreover, two pixels also share an FD 5, which is located at a position different from that of the FD 3, the gate 6 of a reset transistor, which resets the FD 3, a drain 7, to which a power-supply voltage VDD is supplied, the gate 8 of a source-follower transistor, which is configured to amplify a signal charge, the source 9 of the source-follower transistor, the gate 10 of a selection transistor, which is configured to select source follower, and a signal output portion 11 of the pixel, which serves as a source of the selection transistor. Although not directly illustrated, the FD 3, the FD 5, and the gate 8 are electrically interconnected via wirings, and the first exemplary embodiment includes the configuration of a complementary metal-oxide semiconductor (CMOS) sensor in which two pixels share one FD. Moreover, an analog voltage signal obtained by reading out a signal charge from the charge accumulation region 2 is output to the signal output portion 11. Each transistor is configured with, for example, a MOS transistor.

Figure 2:
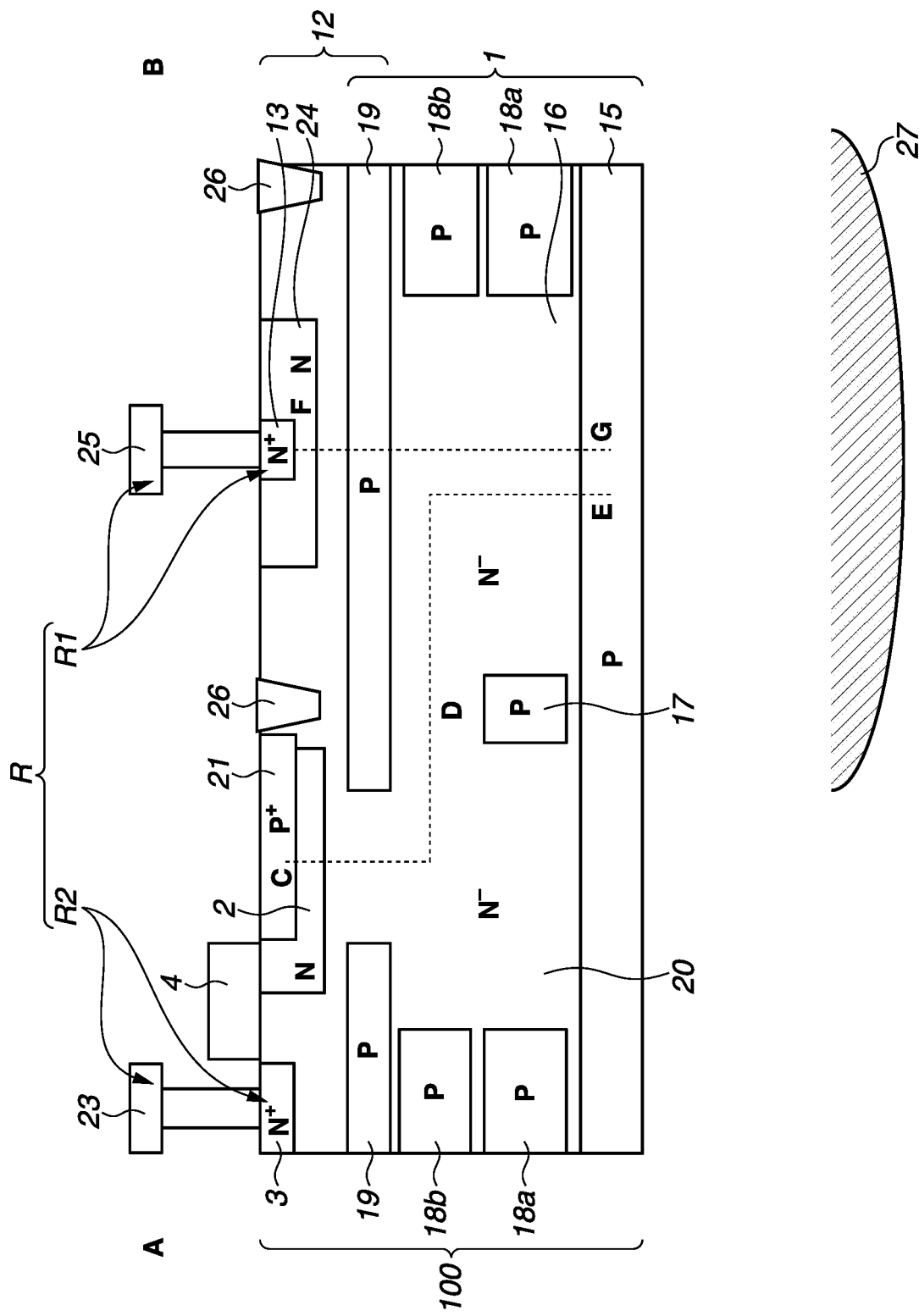
FIG. 2 is a cross-section structure diagram of a pixel in the first exemplary embodiment.

FIG. 2 represents an A-B cross-section in FIG. 1. As illustrated in FIG. 2, the semiconductor substrate 100 includes the PD 1, the charge accumulation region 2, and the avalanche diode 12. The PD 1 is formed from a P-type semiconductor region 15, which is formed on the back surface side of the semiconductor substrate 100, a P-type semiconductor region 19, and an N-type semiconductor region 16 (first semiconductor region), which accumulates a photoelectrically converted signal charge. The charge accumulation region 2 is formed from an N-type semiconductor region (fourth semiconductor region). A P-type semiconductor region 21 is formed between the charge accumulation region 2 and the front surface of the semiconductor substrate 100, so that a PN-junction plane is configured with the charge accumulation region 2 and the P-type semiconductor region 21. This enables reducing dark current which occurs at the interface portion of the P-type semiconductor region 21.

An N-type semiconductor region 20 is arranged in a region which overlaps the charge accumulation region 2 in planar view. The N-type semiconductor region 20 is a region having an impurity concentration lower than the impurity concentration of the charge accumulation region 2.

The avalanche diode 12 is arranged on the front surface side of the semiconductor substrate 100 and is formed from an N-type semiconductor region (third semiconductor region) equivalent to the cathode 13, an N-type semiconductor region 24, and the P-type semiconductor region 19 (second semiconductor region) arranged between the cathode 13 and the N-type semiconductor region 16. The P-type semiconductor region 19 defines the depth of the PD 1 measured from the back surface of the semiconductor substrate 100. The N-type semiconductor region 24 has an impurity concentration lower than that of the N-type semiconductor region equivalent to the cathode 13, and is arranged between the cathode 13 and the P-type semiconductor region 19.

As illustrated in FIG. 2, a P-type semiconductor region 17, which isolates a part of a portion between the N-type semiconductor region 16 and the N-type semiconductor region 20, is arranged between the N-type semiconductor region 16 and the N-type semiconductor region 20.

A P-type semiconductor region 18a and a P-type semiconductor region 18b are arranged between adjacent pixels. The P-type semiconductor region 18b is not arranged between the N-type semiconductor region 16 and the N-type semiconductor region 20. Thus, a region (portion D) in which a part of a portion between the N-type semiconductor region 16 and the N-type semiconductor region 20 is not isolated is formed between the N-type semiconductor region 16 and the N-type semiconductor region 20.

Figure 4:
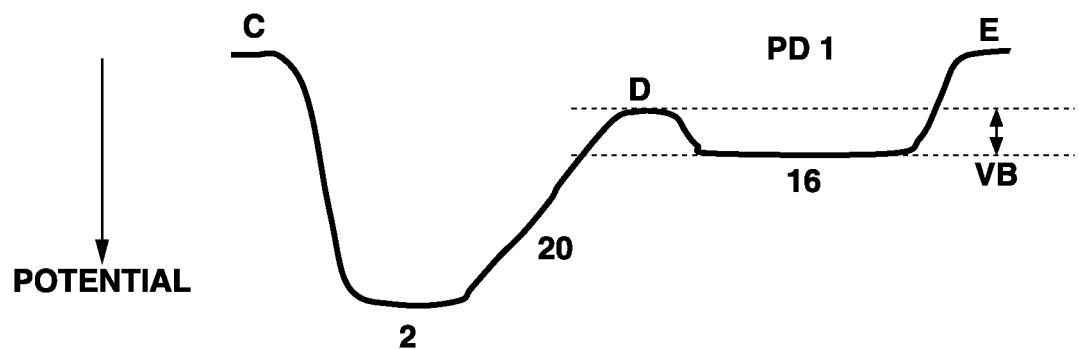
FIG. 4 is a potential diagram used to explain an operation of a pixel in the first exemplary embodiment.
Figure 6:
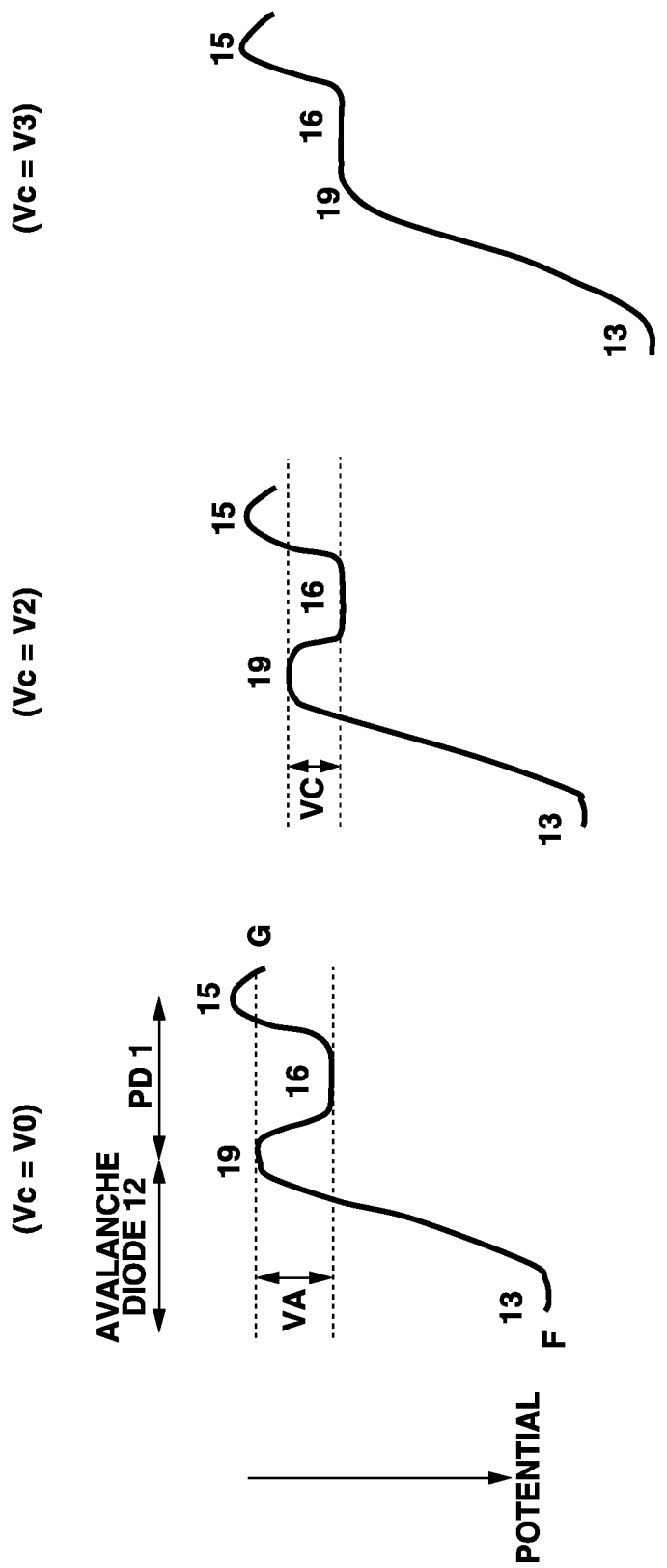
FIG. 6 is a potential diagram used to explain an operation of a pixel in the first exemplary embodiment.

As illustrated in FIG. 2, the portion D, which serves as a boundary between the PD 1 and the N type semiconductor region 20, has a structure in which an N-type semiconductor region is interposed between the P-type semiconductor region 17 and the P-type semiconductor region 19. The portion D is a portion in which the potential barrier is lowest at the time of signal charge accumulation for electrons accumulated in the N-type semiconductor region 16, which is surrounded by the P-type semiconductor regions 15, 17, 18, and 19. Therefore, while electrons generated by reception of incident light are accumulated in the N-type semiconductor region 16, electrons exceeding a saturation signal amount for the N-type semiconductor region 16 overflow to the N-type semiconductor region 20 via the portion D and are then accumulated in the charge accumulation region 2. As illustrated in FIG. 4 and FIG. 6, during a signal accumulation operation, the height VA of a potential barrier between the N-type semiconductor region 16 and the cathode 13 is controlled to be higher than the potential barrier VB between the N-type semiconductor region 16 and the charge accumulation region 2. Accordingly, a signal charge with a predetermined amount or less is able to be accumulated in the N-type semiconductor region 16. A signal charge which has exceeded the predetermined amount set for the N-type semiconductor region 16 and thus has overflowed therefrom is transferred to the charge accumulation region 2. The term "a signal charge with a predetermined amount" refers to a maximum charge acceptance amount set for the N-type semiconductor region 16. During a signal accumulation operation, the height VA of the potential barrier is lower than a reverse bias voltage which causes avalanche multiplication to occur.

An element isolation region 26 is provided to isolate pixels from each other and isolate elements in each pixel from each other. The element isolation region 26 is configured with, for example, an insulating member.

In the first exemplary embodiment, a wiring 23 is connected to the FD 3 (fifth semiconductor region). The FD 3, the wiring 23, and a source-follower transistor (not illustrated in FIG. 2) constitute a second readout circuit R2. Moreover, a wiring 25 is connected to the cathode 13 of the avalanche diode 12. The cathode 13 and the wiring 25 constitute a first readout circuit R1.

In the first exemplary embodiment, a readout circuit R includes the first readout circuit R1 and the second readout circuit R2. The readout circuit R selectively performs readout using the first readout circuit R1 for reading out a signal using avalanche multiplication (hereinafter referred to as "first readout") and readout using the second readout circuit R2 for reading out a signal without causing avalanche multiplication to occur (hereinafter referred to as "second readout").

In the first exemplary embodiment, there are different readout paths, i.e., a first readout path (a path indicated by a dashed line F-G) through which a signal charge that is subjected to avalanche multiplication passes and a second readout path (a path indicated by a dashed line C-D-E) through which a signal charge that is not subjected to avalanche multiplication passes.

In the second readout, as a potential which is supplied to the transfer gate 4 changes, a signal charge is transferred from the charge accumulation region 2 to the FD 3. Although not illustrated, a predetermined potential (for example, a ground-level potential) is supplied to the P-type semiconductor region 21, and the other P-type semiconductor regions illustrated in FIG. 2 are also set to the same potential owing to the electrical continuity with the P-type semiconductor region 21.

A microlens 27, which condenses incident light to the N-type semiconductor region 16, is arranged on the back surface side of the semiconductor substrate 100. Moreover, a wiring 25 is electrically connected to a wiring formed in the second semiconductor substrate 110 illustrated in FIG. 8, and, for ease of reference, the second semiconductor substrate 110 is not illustrated in FIG. 2.

Figure 3:
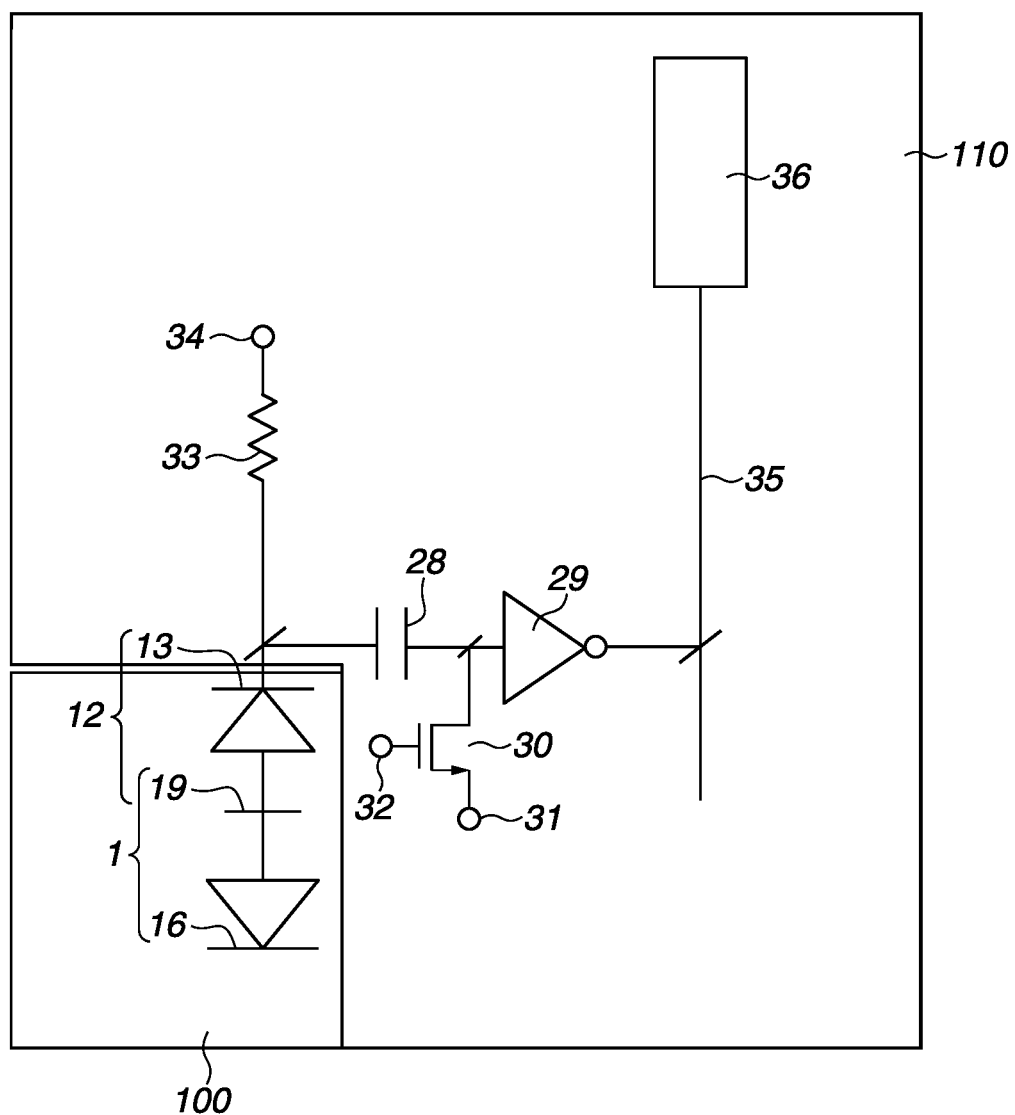
FIG. 3 is a readout circuit diagram of a pixel in the first exemplary embodiment.

FIG. 3 is a circuit diagram of a readout circuit which receives an output from the cathode 13 of the avalanche diode 12 via the wiring 25. As illustrated in FIG. 3, the PD 1 and the avalanche diode 12 are arranged in the first semiconductor substrate 100, and the readout circuit is arranged in the second semiconductor substrate 110. In FIG. 3, the readout circuit includes a coupling capacitance 28, an inverter 29 having an input portion capacitive-coupled to the cathode 13, a MOS transistor 30, which is configured to reset the input portion of the inverter 29, a source 31, which imparts a reset potential for the input portion of the inverter 29, an input terminal 32 of the MOS transistor 30, a resistor 33, a potential control portion 34, an output line 35, and a digital counter 36 connected to each output line 35. In the first exemplary embodiment, the digital counter 36 is a counting circuit which counts the number of occurrences of avalanche current which is caused to occur by avalanche multiplication. In FIG. 3, each pixel includes the readout circuit. Furthermore, a plurality of pixels can share some constituent elements of the readout circuit illustrated in FIG. 3. For example, in some cases, the digital counter 36 may be shared by a plurality of pixels.

FIG. 4 illustrates a potential obtained during a signal accumulation operation in the dashed line C-D-E illustrated in FIG. 2. As can be seen from FIG. 2, the N-type semiconductor region 16 of the PD 1 is lower in impurity concentration of the N type than the charge accumulation region 2. Accordingly, as illustrated in FIG. 4, the bottom of the potential of the N-type semiconductor region 16 is shallower than the bottom of the potential of the charge accumulation region 2. Moreover, it is preferable that the maximum signal charge amount which the charge accumulation region 2 is able to accumulate is configured to be sufficiently larger than the maximum signal charge amount which the N-type semiconductor region 16 is able to accumulate with use of, for example, impurity concentration.

Next, readout operations for signal charges from the PD 1 and the charge accumulation region 2, i.e., the first readout and the second readout, are sequentially described. Basically, readout operations are assumed to be sequentially performed for every row of the pixel array.

In the first exemplary embodiment, the first readout circuit R1 and the second readout circuit R2 perform the first readout and the second readout, respectively, irrespective of the amount of generated signal charge. Here, in a case where the amount of a signal charge generated at the PD 1 in a predetermined period is a predetermined amount or less, the entirety of the signal charge is read out by the first readout. In a case where the amount of a signal charge generated at the PD 1 in the predetermined period exceeds the predetermined amount, a part of the signal charge is read out by the first readout and the remaining part of the signal charge is read out by the second readout. In this way, focusing on a signal charge generated at the PD 1, whether a signal charge is read out by the first readout or the second readout is selected according to the amount of a signal charge generated at the PD 1.

In the following description, readout from at least one pixel arranged in one row is described.

The potential of each of the P-type semiconductor regions 15 to 19 is assumed to be a ground level. First, with regard to readout of a signal charge from the charge accumulation region 2 (second readout), a signal charge accumulated in the charge accumulation region (N-type semiconductor region) 2 is transferred to the FD 3 by the transfer gate 4. Then, the signal charge is transferred from the FD 3 to the source-follower transistor and the signal charge is then read out. Thus, a typical readout by a CMOS sensor is applied to readout of a signal that is based on a signal charge from the charge accumulation region 2. Furthermore, readout of a signal charge from the charge accumulation region 2 is performed without causing avalanche multiplication to occur with respect to a signal charge. Therefore, a voltage required for such readout becomes set to the same level as that of an ordinary CMOS sensor. Each of the power-supply voltage for the source-follower transistor connected to the FD 3 (N-type semiconductor region) and the reverse bias voltage which is applied to between the charge accumulation region 2 and the P-type semiconductor region 21 is set to a voltage which does not cause avalanche multiplication to occur. For example, a voltage difference between the charge accumulation region 2 and the P-type semiconductor region 21 is smaller than a voltage difference between the cathode 13 and the P-type semiconductor region 19. Moreover, the height of a potential barrier between the N-type semiconductor region 16 and the charge accumulation region 2 is set to a height which does not cause avalanche multiplication to occur.

Next, readout of a signal charge from the PD 1 is described. Furthermore, the readout of a signal charge from the PD 1 refers to readout of a signal charge with a saturation signal amount or less (first portion) from the N-type semiconductor region 16. In the readout of a signal charge from the PD 1, electrons accumulated in the N-type semiconductor region 16 are gradually transferred to the cathode 13. Then, the number of signal electrons is counted by detecting the number of occurrences of avalanche current caused by each transferred electron. The readout of a signal charge from the PD 1 is performed by what is called a single photon avalanche diode (SPAD) operation. The avalanche current is large and is able to basically make an input referred noise of the readout circuit virtually negligibly smaller.

Figure 5:
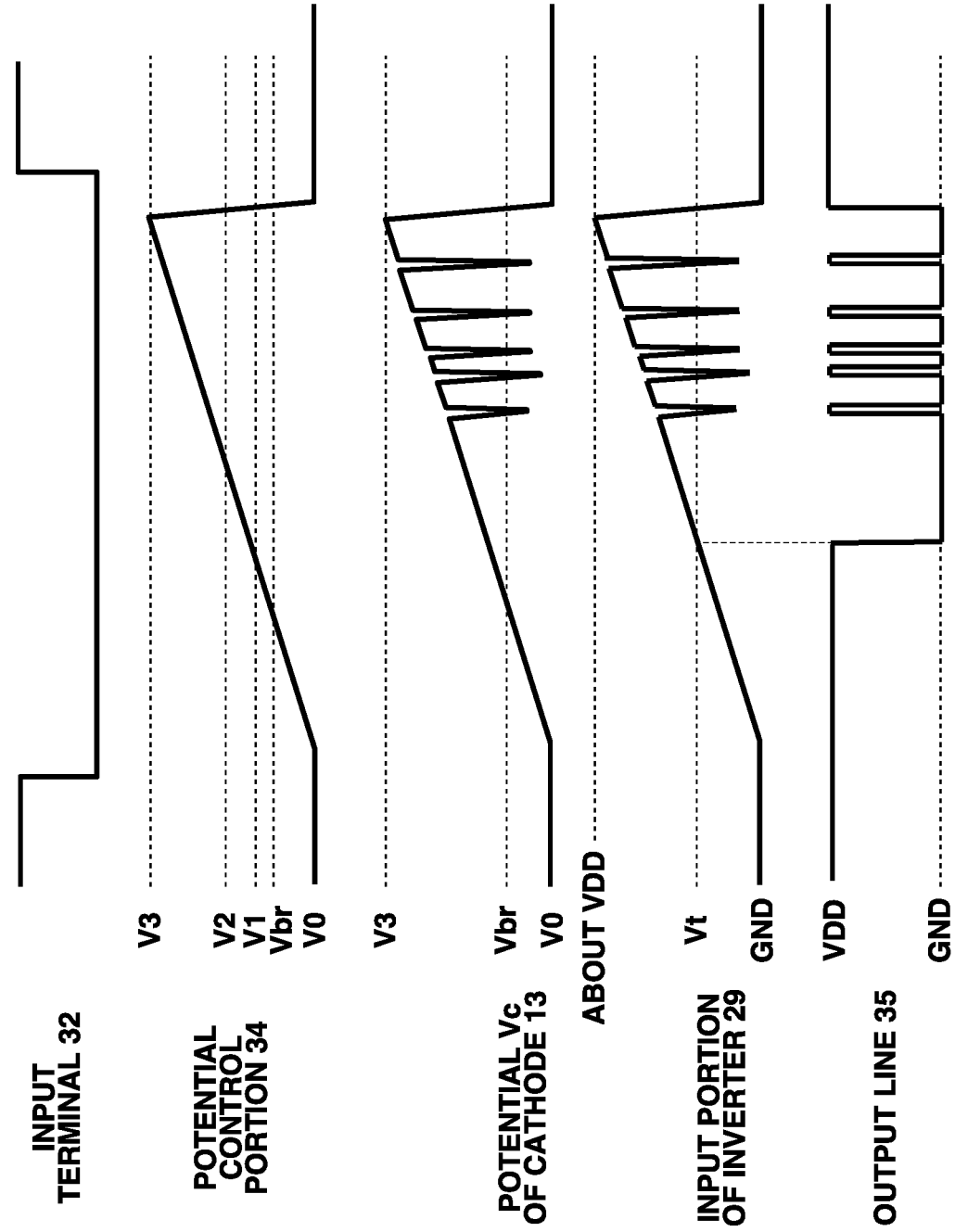
FIG. 5 is a signal readout operation timing chart in a pixel in the first exemplary embodiment.

FIG. 5 is a chart illustrating changes in potential obtained during readout of a signal charge from the PD 1. FIG. 5 illustrates changes in the respective potentials of the input terminal 32, the potential control portion 34, the cathode 13, the input portion of the inverter 29, and the output line 35.

The potential control portion 34 applies a potential to the cathode 13. During readout of a signal charge from the PD 1, potentials lower and higher than the avalanche occurrence potential in the avalanche diode 12 are applied to the potential control portion 34. For example, the potential V0 is 20 V and the potential V3 is 25 V. On the other hand, the source 31 of the MOS transistor 30 is connected to ground. Therefore, when the input terminal 32 is at high level, the potential of the input portion of the inverter 29 is at ground level (0 V). During a period in which readout of a signal charge from the PD 1 is not performed, the input terminal 32 is controlled to be usually at high level. Then, level shift is performed at both electrodes of the coupling capacitance 28, so that the electrode on the side of the inverter 29 is compatible with an operating voltage range of 0 V to VDD (for example, 3.3 V) of the inverter 29 and the MOS transistor 30.

During a period in which electric charges are generated by the PD 1, the potential V0, which does not cause avalanche, is applied from the potential control portion 34 to the cathode 13. During this period, the input terminal 32 is at high level. After the input terminal 32 becomes at low level and the input portion of the inverter 29 enters a floating state, the potential of the potential control portion 34 gradually increases from the potential V0 to the potential V3. Along with this, the potential of the input portion of the inverter 29 is raised via the coupling capacitance 28.

When the potential of the potential control portion 34 is the potential V0, the potential of the input portion of the inverter 29 is at ground level (0 V). At this time, the output of the inverter 29 is at high level. Even when the potential of the input portion of the inverter 29 varies from 0 V, as long as the potential of the input portion thereof is a predetermined potential or less, the output of the inverter 29 is at high level. Assuming that the threshold potential for the inverter 29 is Vt, when the input potential exceeds the threshold potential Vt, the output of the inverter 29 changes from high level to low level. In the first exemplary embodiment, along with a change in the potential of the potential control portion 34, the potential of the input portion of the inverter 29 changes from lower than or equal to the threshold potential Vt to higher than or equal to the threshold potential Vt. When the potential of the potential control portion 34 is the potential V1, the input portion of the inverter 29 is assumed to become at the threshold potential Vt.

When the potential of the potential control portion 34 further increases and, then, the potential of the potential control portion 34 has become the potential V2, signal electrons accumulated in the N-type semiconductor region 16 begin to be transferred to an N-type semiconductor region equivalent to the cathode 13. The potential V2 needs to be larger than the potential V1. This is because, as can be seen from the description below, counting of electrons which are transferred is performed with the output of the inverter 29 becoming from low to high. It is desirable that, when the potential of the potential control portion 34 has reached the potential V3, the input potential of the inverter 29 become at about VDD.

Moreover, the potential Vbr is a potential of the potential control portion 34 obtained when a reverse bias equivalent in magnitude to a breakdown voltage is applied to between the cathode 13 and the P-type semiconductor region 19. When the potential of the potential control portion 34 exceeds the potential Vbr, the avalanche diode 12 becomes active, thus bringing about a state in which an avalanche current is generated. In the first exemplary embodiment, the potential Vbr is closer to the potential V0 than the potential V1. Therefore, before transfer of a signal charge from the N-type semiconductor region 16 to the cathode 13 is started, a reverse bias voltage between the cathode 13 and the P-type semiconductor region 19 exceeds the breakdown voltage.

FIG. 6 is a diagram used to explain manners of potentials obtained when a signal charge accumulated in the N-type semiconductor region 16 is transferred to the cathode 13, thus illustrating potentials in the dashed line F-G illustrated in FIG. 2. The potential Vc is the potential of the cathode 13, which is a potential to be supplied to the potential control portion 34.

In FIG. 6, the potential Vc is the potential of the cathode 13, and represents a potential which is supplied to the potential control portion 34. As mentioned above, the potential V0 is a potential which does not cause an avalanche current to be generated. When the potential Vc is the potential V0, the N-type semiconductor region 16 accumulates a signal charge. The height VA of a potential barrier present between the N-type semiconductor region 16 and an N-type semiconductor region constituting the cathode 13 obtained when the potential Vc is the potential V0 is higher than the height VB of a potential barrier present between the N-type semiconductor region constituting the cathode 13 and the N-type semiconductor region 2. Accordingly, a signal charge with a predetermined amount or less is accumulated in the N-type semiconductor region 16, and a signal charge with an amount exceeding the predetermined amount, which has overflowed from the N-type semiconductor region 16, is transferred to the N-type semiconductor region 2. The height VA of the potential barrier is lower than a reverse bias voltage which causes avalanche multiplication to occur.

Since, as the potential Vc becomes gradually higher, a reverse bias voltage which is applied to the avalanche diode 12 becomes larger, the P-type semiconductor region 19 is gradually depleted, so that a potential barrier between the cathode 13 and the N-type semiconductor region 16 becomes lower. On the other hand, in the N-type semiconductor region 16, a signal charge is accumulated up to the potential of the portion D illustrated in FIG. 4. Accordingly, when the potential of the P-type semiconductor region 19 has become low to the degree of the potential of the portion D, a signal charge accumulated in the N-type semiconductor region 16 begins to be transferred to the avalanche diode 12. The potential Vc obtained at this time is the potential V2. Moreover, when the potential Vc has become the potential V3, a signal charge accumulated in the N-type semiconductor region 16 is completely transferred, so that there is no remaining signal charge in the N-type semiconductor region 16.

During at least a period in which the potential Vc is between the potential V2 and the potential V3, a reverse bias voltage which causes avalanche multiplication to occur is applied to between the cathode 13 and the P-type semiconductor region 19. As illustrated in FIG. 6, the height VC of a potential barrier between the cathode 13 and the N-type semiconductor region 16 obtained when a signal charge accumulated in the N-type semiconductor region 16 is being transferred to the N-type semiconductor region constituting the cathode 13 is configured to be lower than the height VB of the potential barrier. Specifically, at a point of time when the potential Vc is the potential V2, the height VB of the potential barrier and the height VC of the potential barrier become equal to each other, and, as the potential Vc comes closer to the potential V3, the height VC of the potential barrier becomes lower than the height VB of the potential barrier. Accordingly, a signal charge accumulated in the N-type semiconductor region 16 is transferred to not the charge accumulation region 2 but the cathode 13.

As can be seen from the above description, the period in which the potential of the cathode 13 is changing from the potential V0 to the potential V3 is a period in which to read out a signal charge remaining in the PD 1.

Next, referring back to FIG. 5, the method of counting signal electrons is described. Assuming that a relationship of potentials V0<Vbr<V1<V2<V3 is set as illustrated in FIG. 5, suppose a state in which the potential of the potential control portion 34 has become higher than or equal to the potential V2.

When one signal electron has been transferred from the N-type semiconductor region 16 to the avalanche diode 12 and thus has caused an avalanche current to be generated, the potential of the cathode 13 decreases due to an avalanche current flowing through the resistor 33. As mentioned above, when transfer of a signal charge from the N-type semiconductor region 16 to the cathode 13 is started, the output of the inverter 29 is at low level. When the potential of the cathode 13 decreases due to the avalanche current, the potential of the input portion of the inverter 29 changes to lower than or equal to a predetermined potential Vt. Accordingly, the output of the inverter 29 changes from low level to high level. As a result, a signal charge is transferred from the N-type semiconductor region 16 to the N-type semiconductor region (cathode) 13, so that rectangular pulses are output from the inverter 29 according to the presence or absence of an avalanche-multiplied signal charge.

When the potential Vc becomes lower than the potential Vbr, the avalanche diode 12 becomes inactive, so that an avalanche current stops. Then, the potential Vc is caused to return to the potential of the potential control portion 34 by the resistor 33. The details in this respect are as follows. During a period in which a reverse bias voltage enough to cause electronic avalanche to occur is applied to the avalanche diode 12, when one signal electron is transferred to the avalanche diode 12, electrons are multiplied due to avalanche multiplication. A current obtained by the multiplied electrons flows to the connection node between the avalanche diode 12, the inverter 29, and the resistor 33. Then, due to a voltage trop caused by such a current, the potential of the cathode 13 of the avalanche diode 12 becomes lower, so that the avalanche diode 12 stops avalanche multiplication. After that, since the potential of the potential control portion 34 is supplied to the cathode 13 of the avalanche diode 12 via the resistor 33 without the occurrence of a voltage drop, avalanche multiplication is caused to occur again during next electron transfer.

The role of the resistor 33 is to temporarily stop avalanche multiplication caused by a signal charge and to, immediately after stopping avalanche multiplication, bring an operating area of the avalanche diode 12 into an avalanche active state.

The inverter 29 detects a change in the potential Vc and outputs, as a pulse waveform, count pulses to the output line 35. The inverter 29 is connected to the digital counter 36, which is a counting circuit that counts the number of occurrences of avalanche current. The digital counter 36 counts the number of pulses output from the inverter 29 and thus outputs a count value obtained by accumulating the number of pulses. As explained above, the digital counter 36 counts the number of occurrences of avalanche current, i.e., electrons which are transferred.

In FIG. 5, five signal electrons are transferred, and five count pulses corresponding to such signal electrons are illustrated.

From the above description, the necessity of a potential relationship of V0<Vbr<V1<V2<V3 can be understood. In the case of V0<Vbr, a configuration in which, at the time of Vc=V0, the avalanche diode 12 is inactive, thus not causing an avalanche current to occur, is employed. This enables a configuration in which, when transfer of a signal charge is not performed, avalanche consumption current caused by, for example, dark electrons does not occur. Moreover, setting Vbr<V2 enables counting signal electrons which are transferred while the avalanche diode 12 is in active state. Although the necessity of V1<V2 has been described above, Vbr<V1 is also necessary. This enables the inverter 29 to detect a change in the potential Vc caused by an avalanche current generated by one signal electron.

For example, the impurity concentration of the P-type semiconductor region 19, the depth of the semiconductor substrate 100 from the back surface thereof, the threshold voltage value of the inverter 29, and the magnitude of the coupling capacitance 28 are determined in such a manner that a relationship of V0<Vbr<V1<V2<V3 is established and, as a favorable condition, in the case of Vc=V3, the input portion of the inverter 29 becomes at about the power-supply voltage VDD.

In the above description, first readout which reads out a signal charge using avalanche multiplication and second readout which reads out a signal charge without causing avalanche multiplication to occur with respect to the signal charge have been described. In the following description, a signal obtained by readout of a signal charge from the PD 1 is denoted by S1, and a signal obtained by readout of a signal charge from the charge accumulation region 2 is denoted by S2. For ease of explanation, S1 and S2 are assumed to be expressed by the number of signal electrons.

According to the first exemplary embodiment, the gain of the first readout and the gain of the second readout can be made equal to each other. Accordingly, as compared with the photoelectric conversion device discussed in Japanese Patent Application Laid-Open No. 2007-266556, a signal-to-noise (S/N) ratio for low luminance can be made higher. As a specific example, in the first readout, since signal electrons are counted, the counted number is set as S1. In the second readout, an output signal voltage caused by source follower is denoted by VS2. When a source-follower output portion per one signal electron is denoted by ΔV, a condition of S2=VS2/ΔV is obtained, in which each of S1 and S2 represents the number of signal electrons.

While such conversion from VS2 into S2 and signal processing described below are assumed to be performed by a signal processing system outside the photoelectric conversion device, a signal processing circuit system can be formed inside the photoelectric conversion device and such processing operations can be performed inside the photoelectric conversion device.

FIG. 7 illustrates a simple algorithm for signal processing. Signal processing is changed according to a comparison between the signal S1 and a predetermined signal amount S0. The predetermined signal amount S0 is assumed to be a value smaller than the saturation number of electrons of the N-type semiconductor region 16. Specifically, the predetermined signal amount S0 is set in such a manner that, if the signal S1 is smaller than or equal to the predetermined signal amount S0, there is almost no overflow from the N-type semiconductor region 16 to the charge accumulation region 2 and the signal S2 becomes almost 0. If the predetermined signal amount S0 is not set to such a value, although a signal charge has been transferred to the charge accumulation region 2, a situation in which the signal S2 is not added and the signal S2 is ignored occurs, so that a signal range in which a proportional relationship between an incident light amount and a signal amount breaks up appears.

For example, if the saturation number of electrons of the N-type semiconductor region 16 is 200 electrons, the predetermined signal amount S0 is set to a value smaller to some extent than 200 electrons, for example, in such a manner that the predetermined signal amount S0 is equal to 64 electrons, so that such a problem that a signal range in which an incident light amount and a signal amount are not proportionate to each other appears does not occur. Usually, in such a signal range that the pixel signal is smaller than 64 electrons, a light shot noise is also small. Accordingly, due to the influence of a readout noise, the S/N ratio is greatly affected. However, the signal S1 is a signal read out with use of avalanche multiplication and basically does not involve a readout noise. Then, in this case, the signal S2, which involves a readout noise, is not added to the pixel signal. Accordingly, in a signal range such as mentioned above, a high S/N ratio pixel signal with no readout noise can be obtained.

On the other hand, the signal S2 is a signal obtained by readout from a CMOS sensor, and is assumed to contain a readout noise equivalent to, for example, 5 electrons. Therefore, in a case where the signal S1 is larger than or equal to 64 electrons, since both the signal S1 and the signal S2 are used for pixel signal composition, the obtained composite signal contains a readout noise equivalent to 5 electrons.

However, the signal S2, which is obtained by readout from a CMOS sensor, has a sufficient range for a saturation signal, and, furthermore, if such a readout noise is merely about 5 electrons, a light shot noise is dominant in a range in which the number of pixel signal electrons is larger than or equal to 64 electrons, so that the influence on the S/N ratio is very small and the S/N ratio is almost determined by a light shot noise.

As described above, a pixel signal which is obtained in the present exemplary embodiment has an S/N ratio higher than signals obtained by readout from an ordinary charge-coupled device (CCD) sensor or an ordinary CMOS sensor. In particular, in the case of a low output signal, i.e., in a situation in which the amount of incident light is small, the photoelectric conversion device in the present exemplary embodiment does not produce a signal involving a readout noise, and, therefore, has a significant advantageous effect of obtaining a high S/N ratio signal.

Moreover, in the following description, an advantageous effect in the present exemplary embodiment of obtaining a higher S/N ratio than in conventional art is described.

For a fair comparison, the total number of signal electrons generated in two pixels before avalanche multiplication in the conventional art is assumed to be, for example, 100, and the number of pixel signal electrons in the present exemplary embodiment is also assumed to be 100.

Then, in the conventional art, the number of signal electrons without being subjected to avalanche multiplication is assumed to be 36, the number of signal electrons subjected to avalanche multiplication is assumed to be 64, and the avalanche multiplication rate is assumed to be 100.

The S/N ratio of a pixel signal in the present exemplary embodiment is almost dominated by a light shot noise as mentioned above, and, therefore, becomes 100/10=10 because the σ value of a light shot noise is usually represented by the root of the number of signal electrons.

On the other hand, in the conventional art, a readout nose is ignorable owing to avalanche multiplication.

Therefore, S=64×100+36=6436, and, moreover, since the root of 64 is 8 and the root of 36 is 6, N=the root of {the squarer of (8×100)+the square of 6}=800, so that S/N=6436/800≈8.05. Accordingly, since 10>8.05, the present exemplary embodiment is higher in S/N ratio than the conventional art.

This magnitude relationship is established with any number of signal electrons. This is because, in the conventional art, since a signal charge not subjected to avalanche multiplication is sufficiently smaller than a signal charge subjected to avalanche multiplication, the S/N ratio is almost determined by the S/N ratio of a pixel subjected to avalanche multiplication. In the above-mentioned example, the S/N ratio of a pixel subjected to avalanche multiplication is 64/8=8 and is very close to the value 8.05 of the S/N ratio obtained at the time of summation of signals, and the contribution of a signal charge not subjected to avalanche multiplication to the S/N ratio is merely slightly increasing 8 to 8.05.

As mentioned above, adding two signals with respective different gains is frequently performed to increase a dynamic range, but is lower in S/N ratio than adding two signals with the same gain. In the first exemplary embodiment, since two signals S1 and S2 are added with the same gain, a decrease in S/N ratio is not incurred.

As described above, according to the first exemplary embodiment, as compared with a conventional CMOS sensor, while the dynamic range is maintained, a higher S/N ratio pixel signal can be obtained, particularly, in the case of light from a low-luminance subject.

Additionally, if the PD 1 is configured to have a sufficient saturation and a pixel signal is obtained only by SPAD readout, a signal with no readout noise in the entirety of a pixel signal may be obtained. However, if there are several tens of thousands or more of electrons for one pixel, at least two problems occur. Specifically, SPAD readout requires, for example, a time of about several milliseconds (ms) for one row of pixels, and a case where readout is not completed within a predetermined time to obtain one picture occurs. The reason of time-consuming readout is that, if an average transfer timing interval of respective transferred electrons is not sufficiently secured, a plurality of signal electrons is detected concurrently and count loss occurs. Moreover, as a problem with electric power, since an avalanche current flows through a high-voltage power source for every signal electron, a large amount of power is required. Accordingly, in a case where only SPAD readout is used for configuration, the saturation signal amount has to be made smaller, in other words, the dynamic range has to be sacrificed.

However, according to the first exemplary embodiment, since the number of signal electrons from the PD 1 subjected to SPAD readout is small, the above-mentioned problems do not occur. Accordingly, a sensor with a low power consumption equivalent to a CMOS sensor, a high S/N ratio equivalent to SPAD, and a sufficient dynamic range can be implemented.

Modification Example

Conceivable modification examples of the first exemplary embodiment include the following example.

In a case where the amount of a signal charge generated by the PD 1 in a predetermined period is a predetermined amount or less, the readout circuit R is able to perform the first readout on the entirety of the signal charge. For example, in the case of capturing the image of a low-luminance subject, the second readout does not need to be performed.

Moreover, while, in the first exemplary embodiment, the first readout and the second readout are performed with use of a counter, analog-to-digital (AD) conversion can be performed in another method without using a counter.

Figure 9:
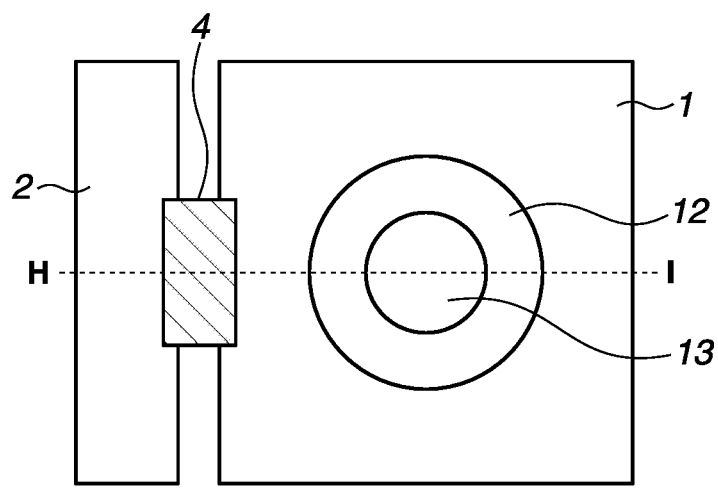
FIG. 9 is a planar layout diagram of a pixel in a second exemplary embodiment.
Figure 10:
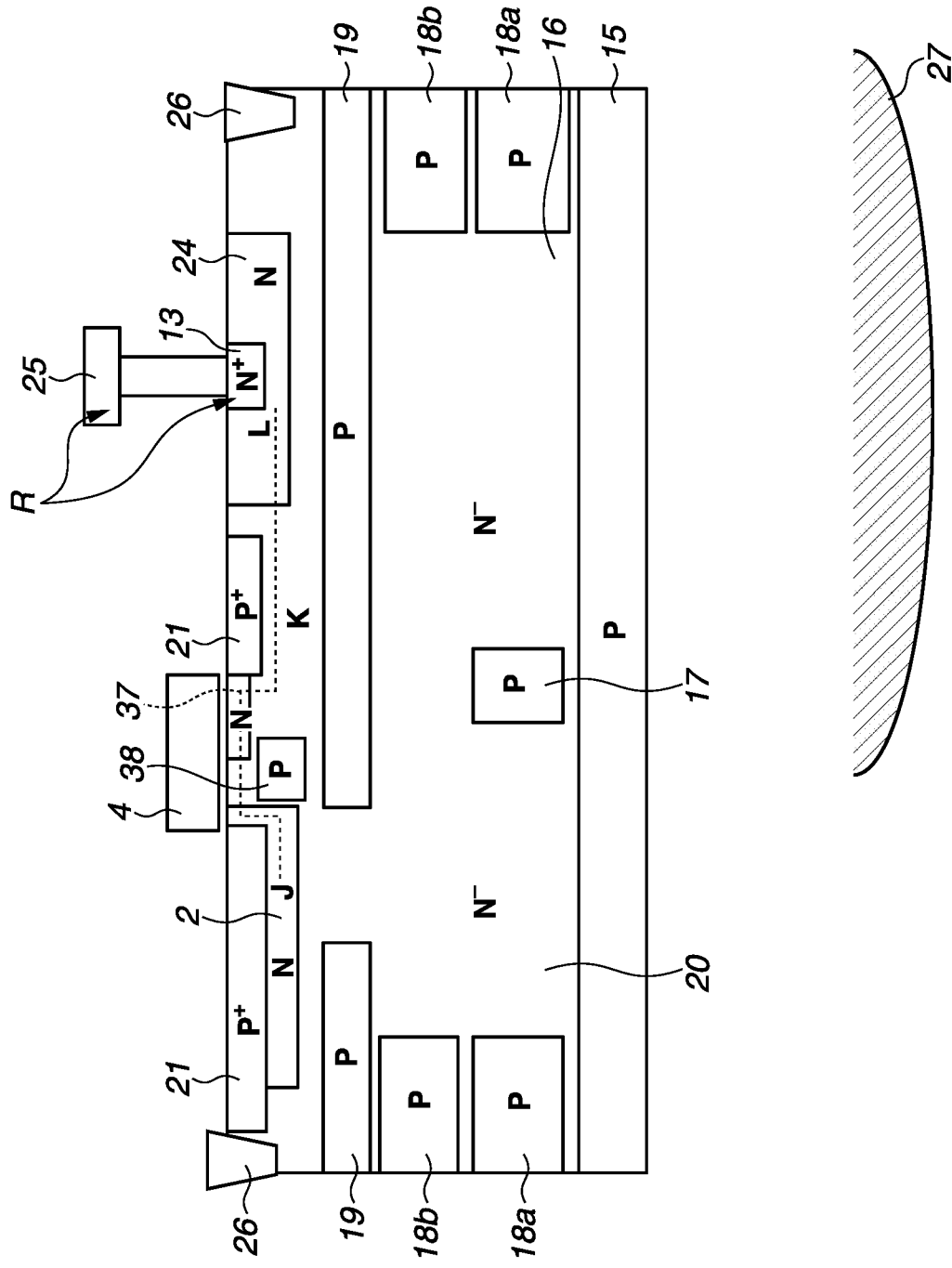
FIG. 10 is a cross-section structure diagram of a pixel in the second exemplary embodiment.

FIG. 9, which represents a second exemplary embodiment, is a planar layout diagram of a semiconductor substrate as viewed from the front surface side thereof. FIG. 10 is a sectional view taken along line H-I in FIG. 9.

In the second exemplary embodiment, the readout circuit R is composed of a single readout circuit, and controls first readout and second readout by controlling the potential to be applied to the cathode 13. Moreover, the second exemplary embodiment is similar to the first exemplary embodiment in that transfer of a signal charge from the charge accumulation region 2 (N-type semiconductor region) is performed by controlling the potential to be supplied to the transfer gate 4, but is different from the first exemplary embodiment in that the destination of such transfer is the cathode 13.

As illustrated in FIG. 9 and FIG. 10, the semiconductor substrate 100 includes an N-type semiconductor region 37 in such a way as to overlap the transfer gate 4 in planar view. The N-type semiconductor region 37 temporarily retains a signal charge transferred from an N-type semiconductor region constituting the charge accumulation region 2, which accumulates a signal charge. A P-type semiconductor region 38, which isolates the charge accumulation region 2 and the N-type semiconductor region 37 from each other, is formed between the charge accumulation region 2 and the N-type semiconductor region 37.

Figure 11:
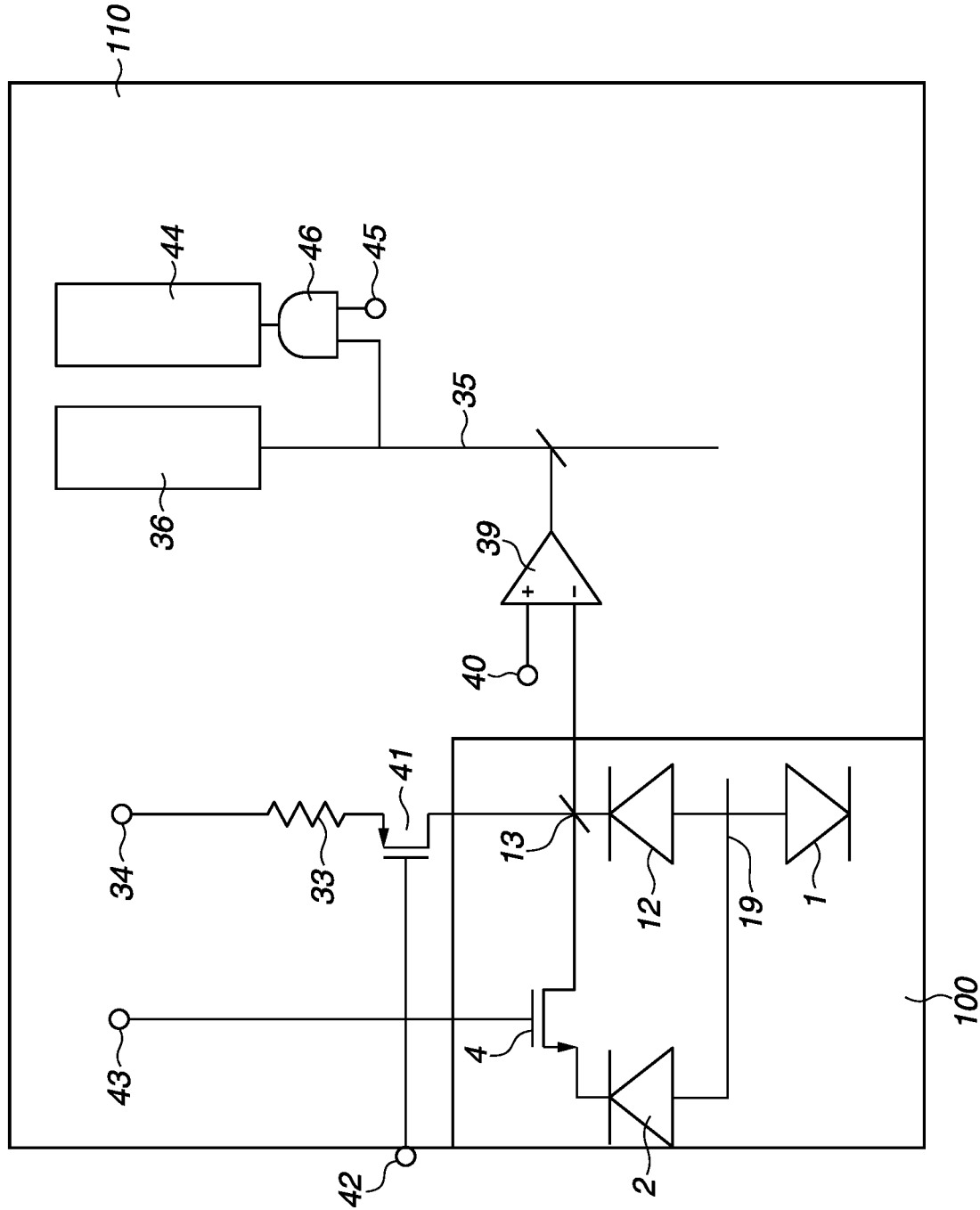
FIG. 11 is a readout circuit diagram of a pixel in the second exemplary embodiment.

FIG. 11 illustrates a readout circuit which receives an output from the cathode 13 via the wiring 25. In FIG. 11, signals read out from the charge accumulation region 2 and the cathode 13 are input to the first input terminal of a comparator 39. A potential is supplied via the second input terminal 40 of the comparator 39. The readout circuit includes a P-type MOS transistor 41, an input terminal 42 via which a desired potential is supplied to the gate of the P-type MOS transistor 41, and an input terminal 43 via which a desired potential is supplied to the gate electrode 4 of the transfer transistor. Moreover, the readout circuit includes a digital counter 44, which is used for readout of a signal from the charge accumulation region 2, separately from the digital counter 36. An AND gate circuit 46 is connected to the digital counter 44, and an input terminal 45 is connected to the AND gate circuit 46. Out of the readout circuit, a resistor 33, potential control portions 34, 40, and 45, the P-type MOS transistor 41, the comparator 39, the digital counters 36 and 44, and the AND gate circuit 46 are formed in the second semiconductor substrate 110.

As mentioned above, in the second exemplary embodiment, unlike the first exemplary embodiment, signal electrons from the charge accumulation region 2 (fourth semiconductor region) are also transferred to an N-type semiconductor region (third semiconductor region) constituting the cathode 13.

A potential to be supplied to the P-type semiconductor regions 15, 17, 18a, 18b, 19, and 21 illustrated in FIG. 10 is set to a large negative potential, for example, −20 V. On the other hand, the range of operating potentials of the P-type MOS transistor 41, the comparator 39, and the cathode 13 illustrated in FIG. 11 is GND to VDD, for example, 0 V to 5 V.

Next, details of the second readout are described with reference to FIG. 12.

Figure 12:
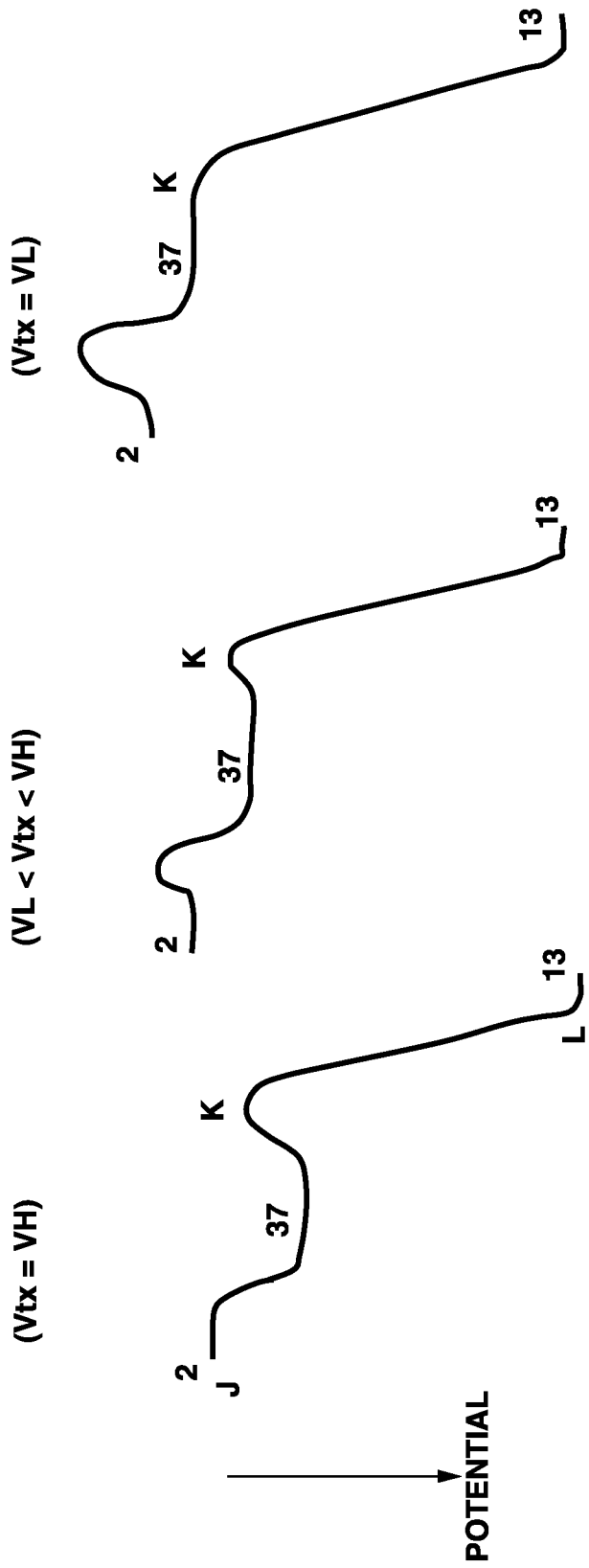
FIG. 12 is a potential diagram used to explain an operation of a pixel in the second exemplary embodiment.

FIG. 12 is a potential diagram in a dotted line J-K-L in FIG. 10. When a potential of the input terminal 43, via which a potential is supplied to the transfer transistor, is denoted by Vtx, the potential Vtx is changed from a potential VL to a potential VH higher than the potential VL. If the potential to be supplied to the P-type semiconductor regions 15, 17, 18, 19, and 21 is −20 V, for example, the potential VL is −21 V and the potential VH is −17 V.

Furthermore, since a drive circuit which supplies the potential Vtx usually operates in about the range of GND to a positive power-supply voltage, a level-shift circuit becomes required. Such a level-shift circuit to be used includes a known level-shift circuit.

As illustrated in FIG. 12, during a signal accumulation period, Vtx=V1, and signal electrons which have exceeded the saturation charge amount of the PD 1 are accumulated in the charge accumulation region 2. During signal transfer, the potential of the cathode 13 is set to a potential higher than or equal to 0 V as explained below. When, in such a state, the potential Vtx becomes equal to the potential VH, signal electrons accumulated in the N-type semiconductor region are transferred to the N-type semiconductor region 37, and are temporarily retained therein. Since a portion K located between the P-type semiconductor region 19 and the P-type semiconductor region 21 is a part of the N-type semiconductor region of the semiconductor substrate 100, a potential barrier is formed with respect to the N-type semiconductor region 37. As the potential Vtx decreases from the potential VH, the potential of the N-type semiconductor region 37 is raised, so that a potential barrier with respect to a signal charge retained in the N-type semiconductor region 37 becomes lower. Accordingly, when the potential Vtx becomes equal to the potential VL, such a potential barrier almost disappears, and all of the signal charges retained in the N-type semiconductor region 37 are transferred to the cathode 13.

Furthermore, in the above-mentioned horizontal signal transfer path leading to the cathode 13, a structure between portions K and L is determined in such a manner that such an intense electric field as to cause avalanche to occur is not generated. For example, such a structure that the distance between the portions K and L is sufficiently longer than the distance between the cathode 13 and the P-type semiconductor region 19 can be conceived. Therefore, in the above-mentioned horizontal signal transfer, multiplication of a signal charge does not occur.

Readout of respective signal electrons from the PD 1 and the charge accumulation region 2 is described based on the above description.

First, readout of signal electrons from the PD 1 is basically the same as the first readout described in the first exemplary embodiment. However, the operating potential range is shifted as a whole by, for example, about −20 V. The P-type MOS transistor 41 is in an ON state, the potential V0 to be applied to the potential control portion 34 is GND, and the potential V3 is, for example, 5 V, which is close to VDD. Moreover, the comparator 39 is used instead of the inverter 29, and the cathode 13 is directly connected to the first input terminal of the comparator 39. Therefore, as described in the first exemplary embodiment, the potential V1 is equal to the potential Vt.

Such a potential V1 as to satisfy a relationship of V0<Vbr<V1<V2<V3 is applied to the second input terminal 40. Accordingly, an avalanche current caused by signal electrons from the PD 1, which are transferred when the potential of the potential control portion 34 gradually changes from the potential V0 to the potential V3, is detected by the comparator 39, and the number of occurrences of such avalanche currents is counted by the digital counter 36.

Next, readout of signal electrons from the charge accumulation region 2 is described. Readout from the charge accumulation region 2 is second readout which does not cause avalanche multiplication to occur, and is basically similar to readout from a CMOS sensor. The cathode 13 serves as a floating diffusion (FD) portion.

Figure 13:
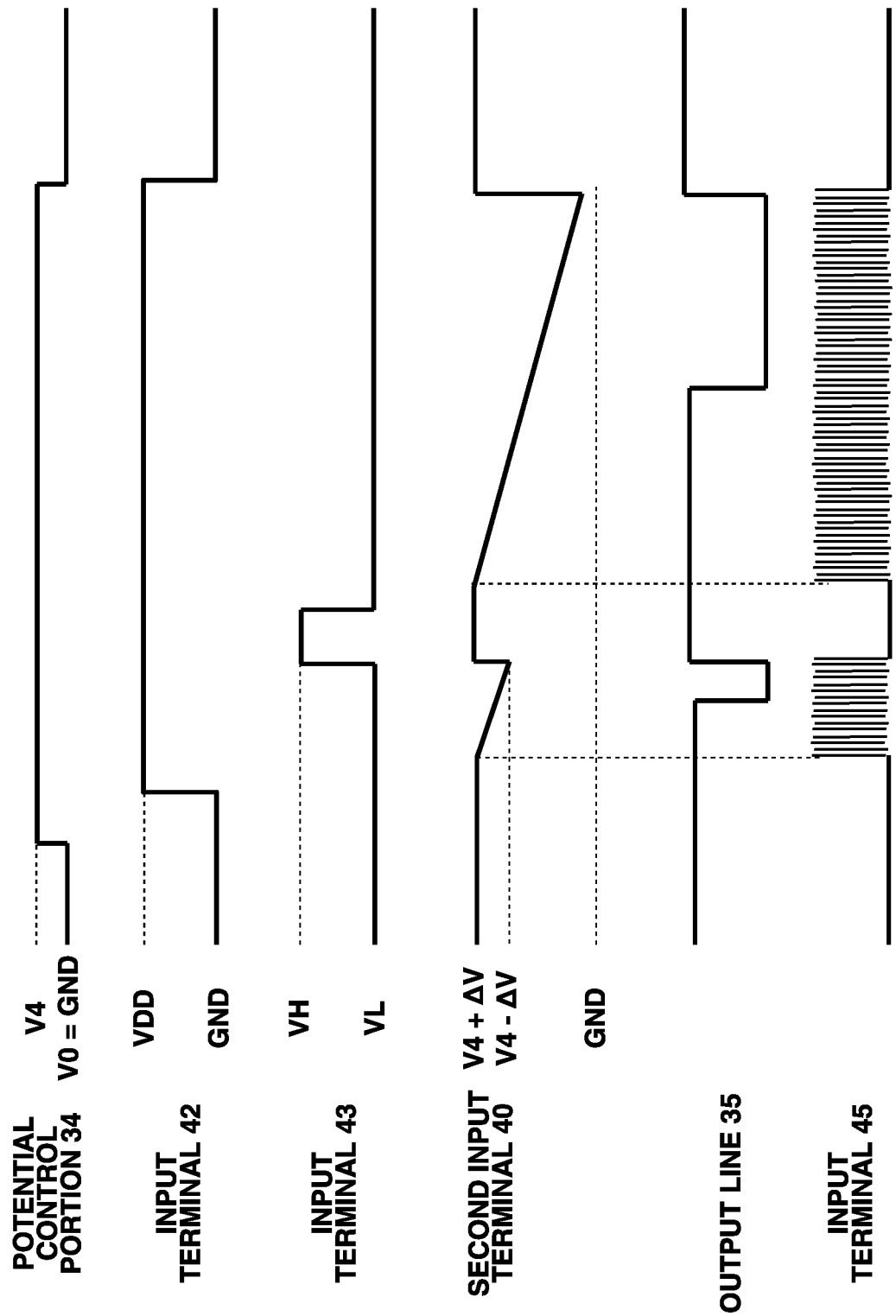
FIG. 13 is a signal readout operation timing chart in a pixel in the second exemplary embodiment.

FIG. 13 is a timing chart illustrating drive pulses and changes in potential of respective portions in readout of signals from the charge accumulation region 2. In FIG. 13, the potential V4 is a reset potential for the cathode 13, and V0=GND<V4<Vbr. For example, Vbr=1.8 V, V4=1.6 V, and, during a readout time for the charge accumulation region 2, the avalanche diode 12 continues to be in an inactive state.

While, as mentioned above, in signal transfer in a path between the portions K and L, avalanche does not occur, such a setting enables preventing, for example, a dark current from being multiplied by the avalanche diode 12 and affecting signals.

When the input terminal 42 becomes at high level, the P-type MOS transistor 41 is turned off, so that the cathode 13 enters a floating state at the potential V4. A potential (V4+ΔV) is applied to the second input terminal 40. ΔV denotes a predetermined voltage portion larger than an offset variation of the comparator 39, for example, 30 mV. Therefore, the potential which is output to the output line 35 is currently at high level. In this state, the potential of the second input terminal 40 begins to decrease at a predetermined speed. Then, concurrently with beginning of such decrease, a predetermined short-period clock signal is input to the input terminal 45. An input clock signal to the counter 44 continues until the output of the comparator 39 is inverted. Since the time to this inversion is proportionate to the reset level for the cathode potential that is based on "V4+ΔV", at this point of time, AD conversion data of the reset potential for the cathode 13 has been recorded on the counter 44. This reset level data is once stored in another memory and the counter 44 is once reset. This memory is not illustrated.

Next, a pulse such as that illustrated in FIG. 13 is applied to the input terminal 43, so that signal electrons accumulated in the charge accumulation region 2 are transferred to the cathode 13, as described above with reference to FIG. 12. The potential of the cathode 13 decreases by an amount corresponding to such signal electrons. After that, at the same time that the potential of the second input terminal 40 begins to decrease at a predetermined speed again, a predetermined short-period clock signal is input to the input terminal 45. This time, too, an input clock signal to the counter 44 continues until the output of the comparator 39 is inverted. When a decrease in potential of the second input terminal 40 has ended, data corresponding to "the reset level+the transfer signal" has been recorded on the counter 44. A difference between this data and the reset level data previously stored in the memory is equivalent to a signal electron amount which has previously been accumulated in the charge accumulation region 2. This difference can be said to be AD conversion data of the signal electron amount.

In digital data serving as a result of first readout (first count value), one bit is equivalent to one signal electron. On the other hand, in digital data serving as a result of second readout (second count value), one bit is determined by the capacitance of the cathode 13, a pulse period for the input terminal 45, and a potential decreasing speed for the second input terminal 40, and, for example, one bit is equivalent to, for example, 8.5 electrons.

Furthermore, signal generation for pixels by the signal S1 and the signal S2 is similar to that in the first exemplary embodiment. Addition processing for adding the first count value and the second count value is performed. At this time, since there is a difference in conversion gain between the signal S1 and the signal S2, as with that described in the first exemplary embodiment, it is necessary to perform correction that is based on a difference in conversion gain with respect to at least one of the first count value and the second count value. The correction that is based on a difference in conversion gain is performed in a known method.

In the second exemplary embodiment, charges are read out from the same readout circuit. Thus, first readout and second readout are performed from one readout circuit R. Accordingly, as compared with the first exemplary embodiment, the magnitude of an area occupied by one pixel can be made smaller.

According to the second exemplary embodiment, a photoelectric conversion device with a low power consumption equivalent to a CMOS sensor, a high S/N ratio equivalent to SPAD, and a sufficient dynamic range can be implemented.

Figure 14:
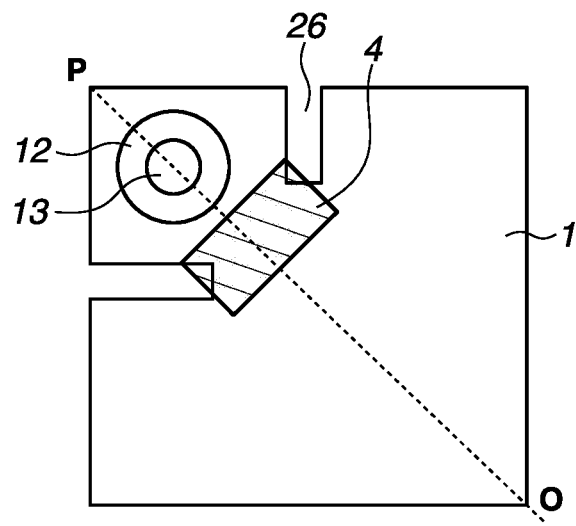
FIG. 14 is a planar layout diagram of a pixel in a third exemplary embodiment.
Figure 15:
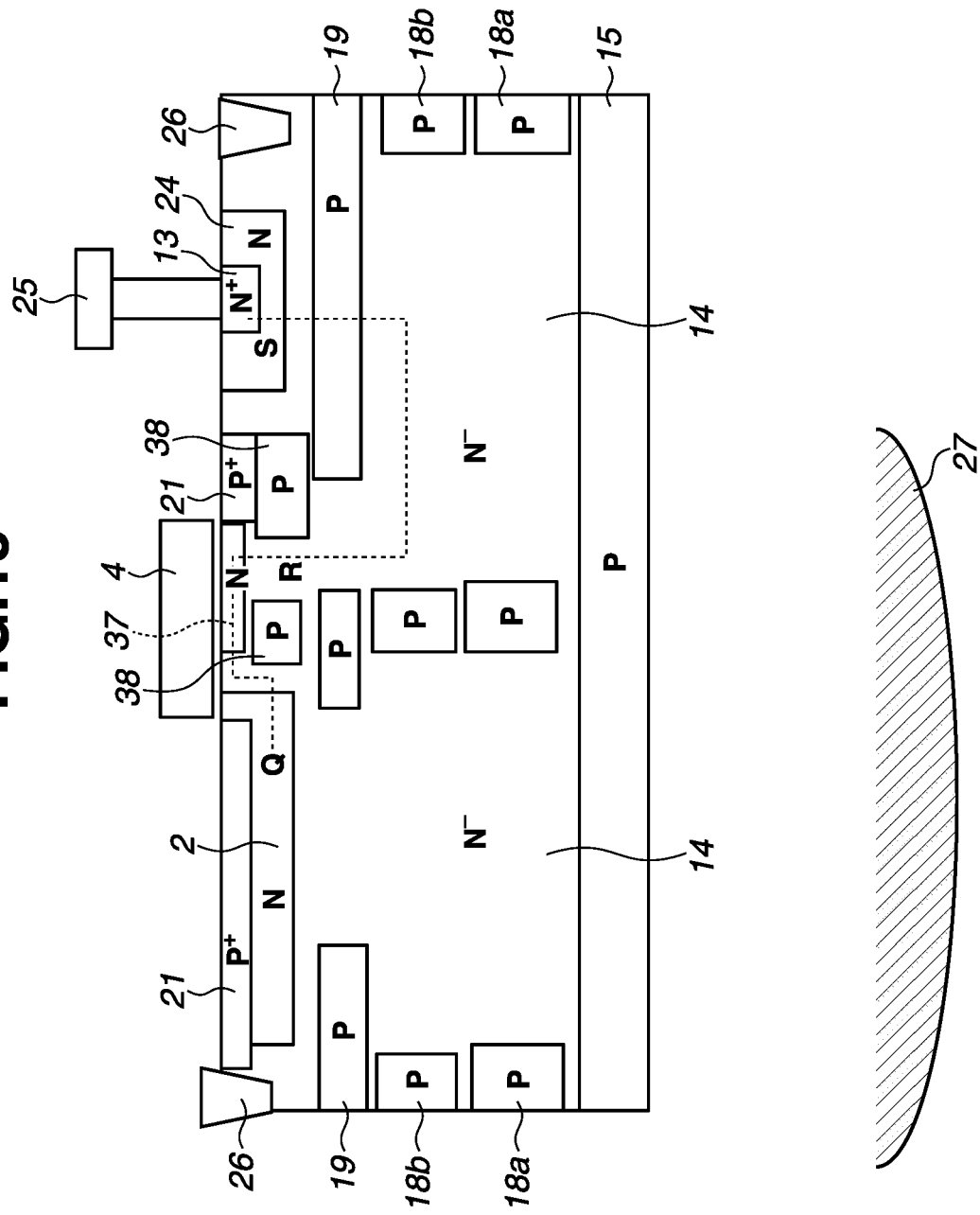
FIG. 15 is a cross-section structure diagram of a pixel in the third exemplary embodiment.

FIG. 14, which represents a third exemplary embodiment, is a planar layout diagram of a semiconductor substrate on the front surface side thereof. FIG. 15 is a sectional view taken along line O-P in FIG. 14.

The third exemplary embodiment differs from the first and second exemplary embodiments in that all of the generated signal charges are accumulated in one charge accumulation region 2. Moreover, the third exemplary embodiment differs from the first and second exemplary embodiments in that, out of signal charges accumulated in the charge accumulation region 2, a predetermined quantity of signal charges is transferred to the cathode 13 and is then read out with use of avalanche multiplication and signal charges exceeding the predetermined quantity are read out without causing avalanche multiplication to occur. In the third exemplary embodiment, the term "predetermined quantity of signal charges" is not a saturation charge amount but a signal charge amount which is settable by a signal transfer structure and a drive condition thereof In FIG. 15, signal electrons generated in an N-type semiconductor region 14 are accumulated in the charge accumulation region 2. Signal electrons accumulated in the charge accumulation region 2 are transferred to the cathode 13 along a dashed line Q-R-S in FIG. 15. In the semiconductor substrate, at a region which overlaps the N-type semiconductor region 37 in planar view, a region R which is sandwiched between two P-type semiconductor regions 38 and is configured with an N-type semiconductor is located. While, in the region R, there is a predetermined potential barrier, there is no potential barrier in a path leading along a dashed line R-S. In other words, a portion of the P-type semiconductor region 19 located opposite to the cathode 13 is depleted by a high voltage applied to both electrodes of the portion, so that a potential barrier disappears there not only during avalanche activation but also during avalanche inactivation.

As illustrated in FIG. 15, all of the signal electrons generated in the N-type semiconductor region 14 are transferred to the cathode 13 via the same readout path. In the third exemplary embodiment, whether to cause avalanche multiplication to occur in a signal charge is controlled by changing a reverse bias voltage which is applied to the P-type semiconductor region 19 and the cathode 13 when a signal charge is transferred to the cathode 13.

Figure 16:
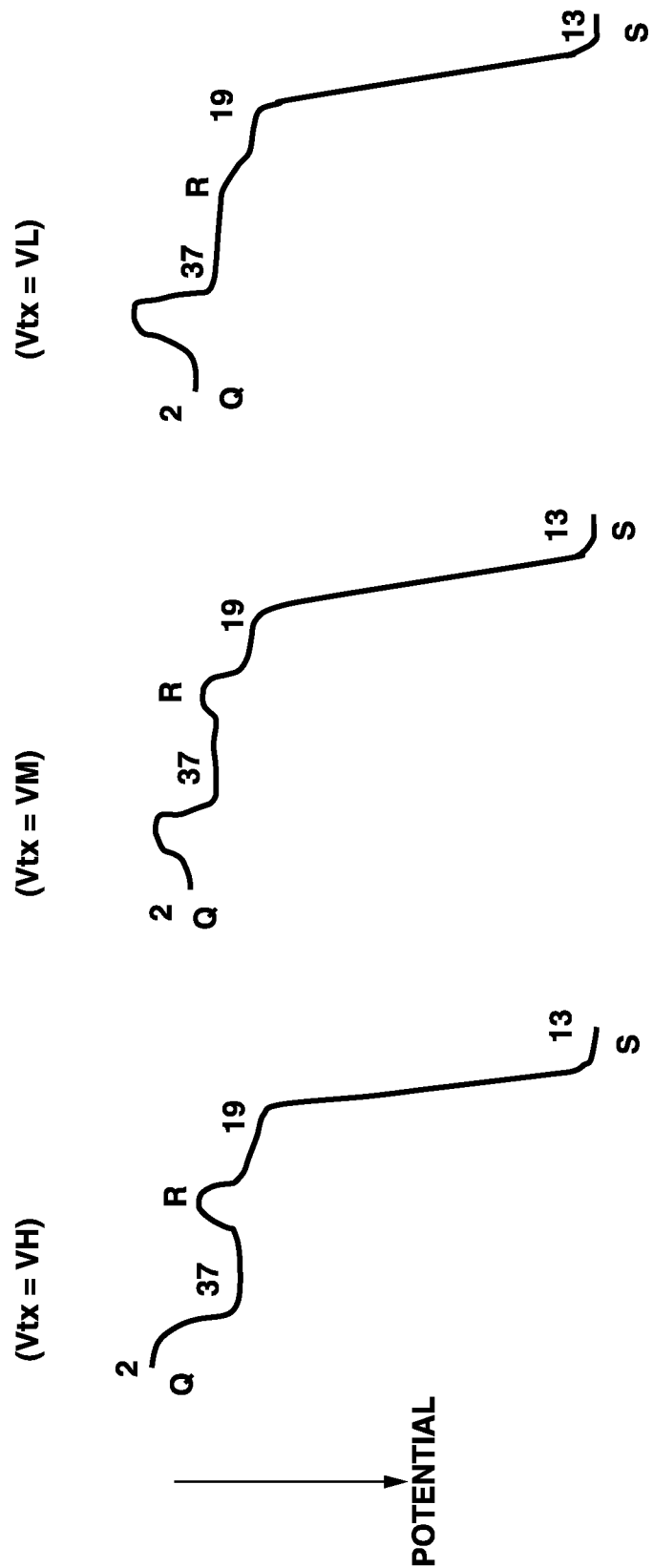
FIG. 16 is a potential diagram used to explain an operation of a pixel in the third exemplary embodiment.

FIG. 16 is a potential diagram of a path indicated by a dashed line Q-R-S illustrated in FIG. 15.

In the third exemplary embodiment, as with the second exemplary embodiment, both two readout methods are arranged to transfer a signal charge to the cathode 13, and two types of subsequent signal readout operations are also similar to those in the second exemplary embodiment. A readout circuit system connected to the cathode 13 is also similar to that in the second exemplary embodiment and is, therefore, omitted from description here.

Figure 17:
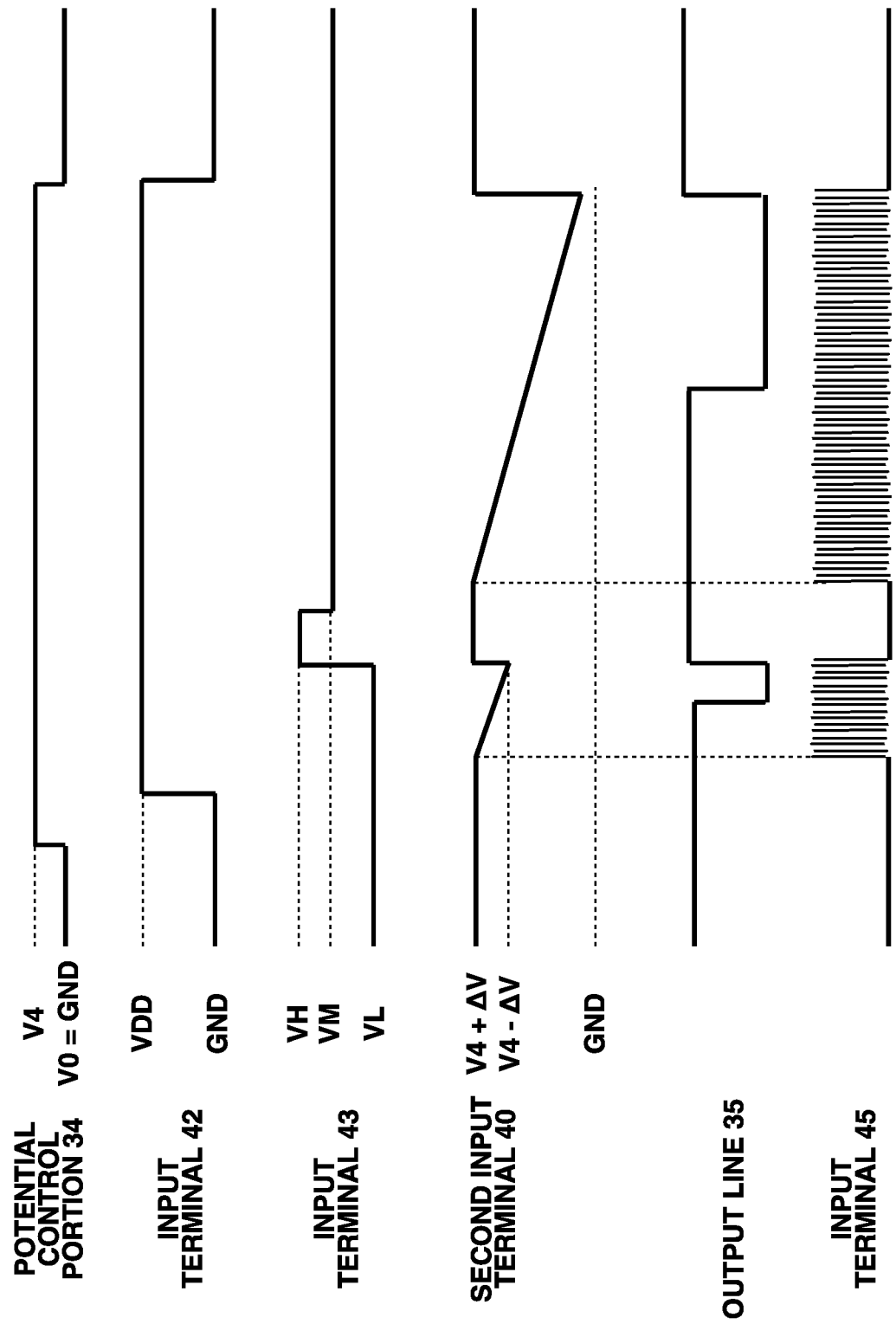
FIG. 17 is a signal readout operation timing chart in a pixel in the third exemplary embodiment.
Figure 18:
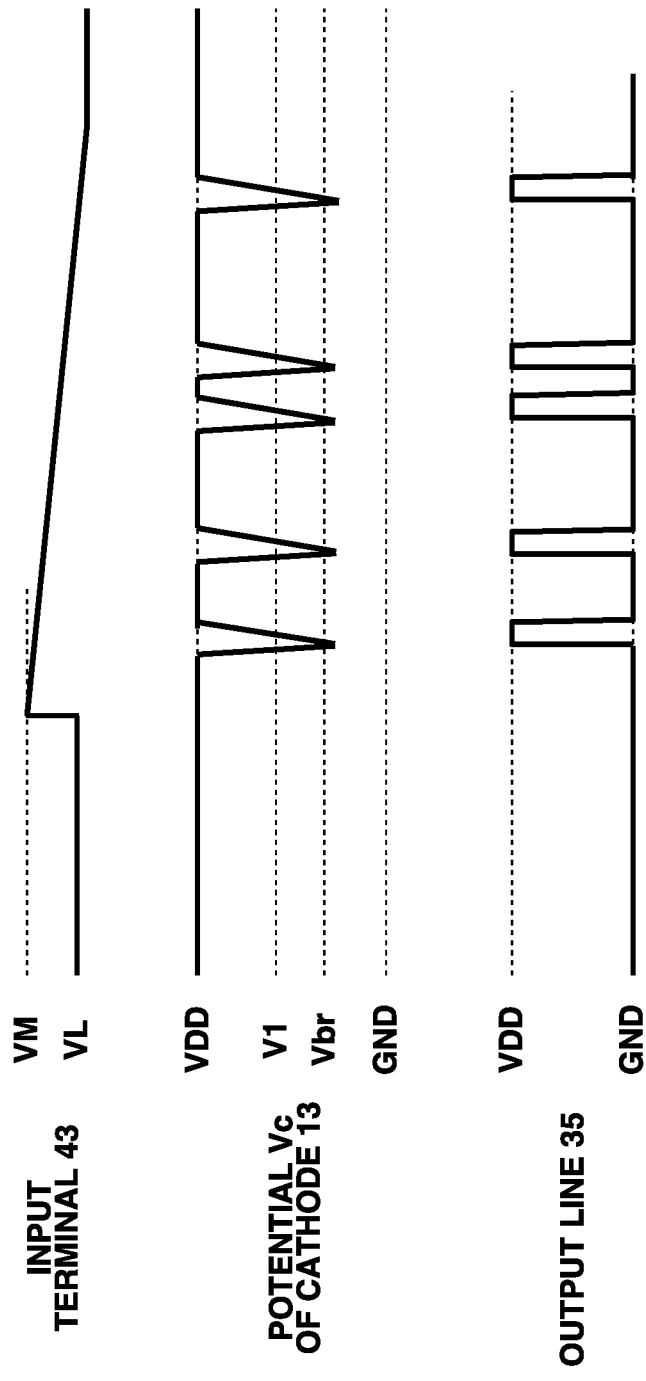
FIG. 18 is a signal readout operation timing chart in a pixel in the third exemplary embodiment.

FIG. 17 is a timing chart obtained during readout of the signal S2 for reading out a signal charge without causing avalanche multiplication to occur, and FIG. 18 is a timing chart obtained during readout of the signal S1 for reading out a signal charge while causing avalanche multiplication to occur. Such respective readout operations are also described with reference to the potential diagram of FIG. 16. Furthermore, the power-supply potential is similar to that in the second exemplary embodiment, and P-type semiconductor regions are set to a large negative potential such as −20 V. Accordingly, the potential Vtx of the transfer gate 4 is controlled to be, for example, a value between −21 V and −17 V. The potential of the cathode 13 is assumed to be, for example, 5 V when the avalanche diode 12 is set to avalanche activation and to be, for example, 1.6 V when the avalanche diode 12 is set to avalanche inactivation.

FIG. 17 differs from FIG. 13 in a transfer pulse for the input terminal 43, and, in FIG. 17, the potential Vtx of the input terminal 43 which is supplied to the transfer gate 4 takes three potential levels VL, VM, and VH. In FIG. 17, when the potential Vtx becomes the potential VH, signal electrons accumulated in the charge accumulation region 2 are transferred to the N-type semiconductor region 37. Next, when the potential Vtx has lowered to the potential VM, as illustrated in FIG. 16, in the region R, a potential barrier with a certain level remains. At this time, signal electrons exceeding the maximum charge accumulation amount of the N-type semiconductor region 37 obtained when the potential Vtx is equal to potential VM are transferred to the cathode 13. For example, the maximum charge accumulation amount obtained when the potential Vtx is equal to the potential VM is assumed to be 200 electrons. Moreover, the maximum charge accumulation amount obtained when the potential Vtx is equal to the potential VH is assumed to be sufficiently large and to be able to sufficiently accept the signal charge amount of the charge accumulation region 2. In a case where the entire signal amount is 3,500 electrons, when the potential Vtx changes from the potential VH to the potential VM, 3,300 electrons are transferred to the cathode 13 and 200 electrons remain in the N-type semiconductor region 37. Accordingly, in this example, the signal S1 is equal to a signal that is based on 200 electrons, and the signal S2 is equal to a signal that is based on 3,300 electrons. If the entire signal amount is 50 electrons, when the potential Vtx is equal to the potential VM, there is no signal charge which is transferred from the N-type semiconductor region 37 to the cathode 13. Therefore, the signal S1 is equal to a signal that is based on 50 electrons, and the signal S2 is equal to zero. AD conversion to be performed on the transferred signal electrons is the same as that described in the second exemplary embodiment, and is, therefore, omitted from description here.

Next, readout of the signal S1 is performed subsequent to the above-mentioned readout of the signal S2. As illustrated in FIG. 18, the potential control portion 34 is set to VDD, thus bringing the avalanche diode 12 into an active state. The input terminal 32 is set to 0 V, so that the P-type MOS transistor 41 enters an ON state.

Potential V1, which satisfies a relationship of "potential V1 >potential Vbr", is applied from the second input terminal 40 to the first input terminal of the comparator 39. Setting of a relationship of "potential V0=GND<potential Vbr<potential V1<potential V3=VDD" is similar to that in the second exemplary embodiment. As the potential of the input terminal 43 is gradually changed from the potential VM to the potential VL, signal charges remaining in the N-type semiconductor region 37, i.e., signal charges which have not exceeded a potential barrier in the region R during readout of the signal S2, are gradually transferred to the cathode 13. Then, as illustrated in FIG. 16, when the potential Vtx is equal to the potential VL, a potential barrier in the region R disappears, so that transfer of all of the remaining signal electrons is completed. The transferred signal electrons cause an avalanche current to be generated in a high electrical field between the P-type semiconductor region 19 and the cathode 13, thus decreasing the potential of the cathode 13. The comparator 39 detects such a decrease and thus generates count pulses, and, then, the count pulses are counted by the digital counter 36. These operations are similar to those described in the first exemplary embodiment with reference to FIG. 5, but differs from the first exemplary embodiment in that signal transfer is controlled by not the potential control portion 34 but the input terminal 43.

The signal S2 in the third exemplary embodiment is not a signal that is based on signal charges which have overflowed from the PD 1 as in the first exemplary embodiment and the second exemplary embodiment but signal charges which overflow from the N-type semiconductor region 37 when the potential Vtx is equal to the potential VM in FIG. 16.

Signal generation for pixels using the signal S1 and signal S2 obtained by the above-described readout operations is similar to that in the first exemplary embodiment.

In the third exemplary embodiment, during readout of the signal S1, the potential control portion 34 is able to be constantly set to a value larger than the potential Vbr, so that readout of the signal S1 becomes stable.

Accordingly, according to the third exemplary embodiment, a sensor with a low power consumption equivalent to a CMOS sensor, a high S/N ratio equivalent to SPAD, and a sufficient dynamic range can be implemented. Moreover, such a sensor can be implemented with a more stable operation than in the first and second exemplary embodiments.

Modification Example

In the above-described third exemplary embodiment, respective readout operations for the signal S1 and the signal S2 have been described. However, in the third exemplary embodiment, any one of the first readout (readout using SPAD) and the second readout (readout which does not involve avalanche) can be selected to read out all of the pixel signals.

More specifically, the potential of the cathode 13 is set to 1.6 V to bring about a floating state, and, in the state of avalanche inactivation, pulses for the input terminal 43 illustrated in FIG. 17 are stopped not at the potential VM but at the potential VL, so that all of the signals are transferred to the cathode 13 and the second readout is able to be performed with respect to all of the signals.

Moreover, the potential of the cathode 13 is set to 5 V, and, in the state of avalanche activation, pulses for the input terminal 43 illustrated in FIG. 18 are changed from the potential VL to the potential VH and further gradually to the potential VL, so that all of the signals for pixels are gradually transferred to the cathode 13 and the first readout is able to be performed with respect to all of the signals.

For example, in a case where almost the entirety of a picture plane is dark and the signal amount of pixels is small, the first readout only needs to be selected to be performed, and, moreover, in a case where almost the entirety of a picture plane is bright and the signal amount of pixels is large, the second readout only needs to be selected to be performed.

In a case where selection of any one of the first readout and the second readout is performed as mentioned above, a readout time and a signal processing time are reduced. Then, selection of one of readout operation modes as mentioned above enables implementing a high S/N ratio in a dark situation and a high dynamic range in a dark situation.

The readout circuit R is able to select whether to perform first readout and whether to perform second readout according to switching of modes. The modes are, for example, International Organization for Standardization (ISO) sensitivity setting.

Figure 19:
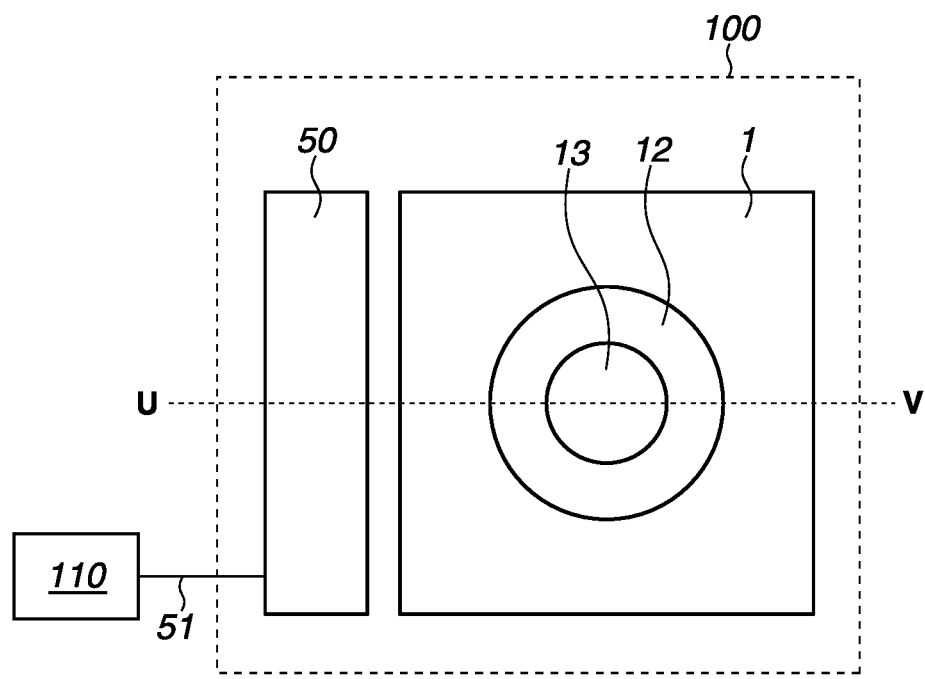
FIG. 19 is a planar layout diagram of a pixel in a fourth exemplary embodiment.
Figure 20:
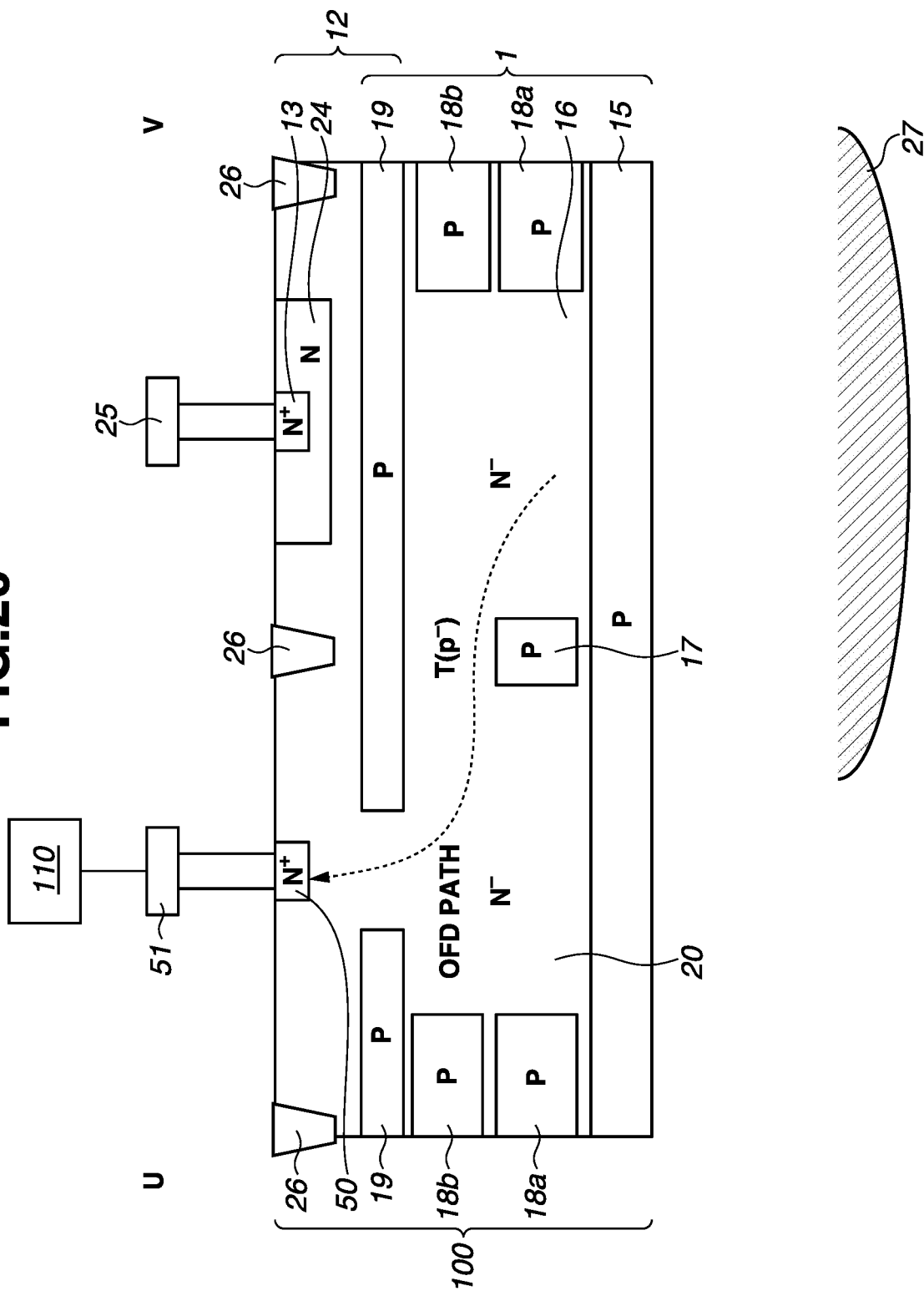
FIG. 20 is a cross-section structure diagram of a pixel in the fourth exemplary embodiment.

FIG. 19, which represents a fourth exemplary embodiment, is a planar layout diagram of a semiconductor substrate as viewed from the front surface side thereof. FIG. 20 is a sectional view taken along line U-V in FIG. 19.

The fourth exemplary embodiment differs from the above-described first to third exemplary embodiments in that the semiconductor substrate 100 contains an overflow drain (hereinafter referred to as an "OFD") 50 and, when a signal charge which has overflowed to the OFD 50 has exceeded a predetermined amount, the second readout circuit operates and performs readout without causing avalanche multiplication to occur. In the fourth exemplary embodiment, the term "signal charge with a predetermined amount" is not the saturation charge amount but the signal charge amount which is able to be set by a drive condition of the readout circuit.

As illustrated in FIG. 19, the PD 1, the avalanche diode 12, and the cathode 13 of the avalanche diode 12 are arranged in the semiconductor substrate 100 in such a way as to overlap each other in planar view. The OFD 50 is formed with an N-type semiconductor region. In FIG. 20, a region sandwiched between the P-type semiconductor region 17 and the P-type semiconductor region 19 is referred to as a portion T. The portion T constitutes a part of a potential barrier surrounding the N-type semiconductor region 16, and is a portion lower in potential barrier than the other parts. Therefore, electrons generated by incident light and accumulated in the N-type semiconductor region 16 flow to the OFD 50 via the portion T when exceeding the saturation signal amount for the N-type semiconductor region 16. A wiring 51 is connected to the OFD 50, and electrons flowing to the OFD 50 are output through the wiring 51.

Figure 21:
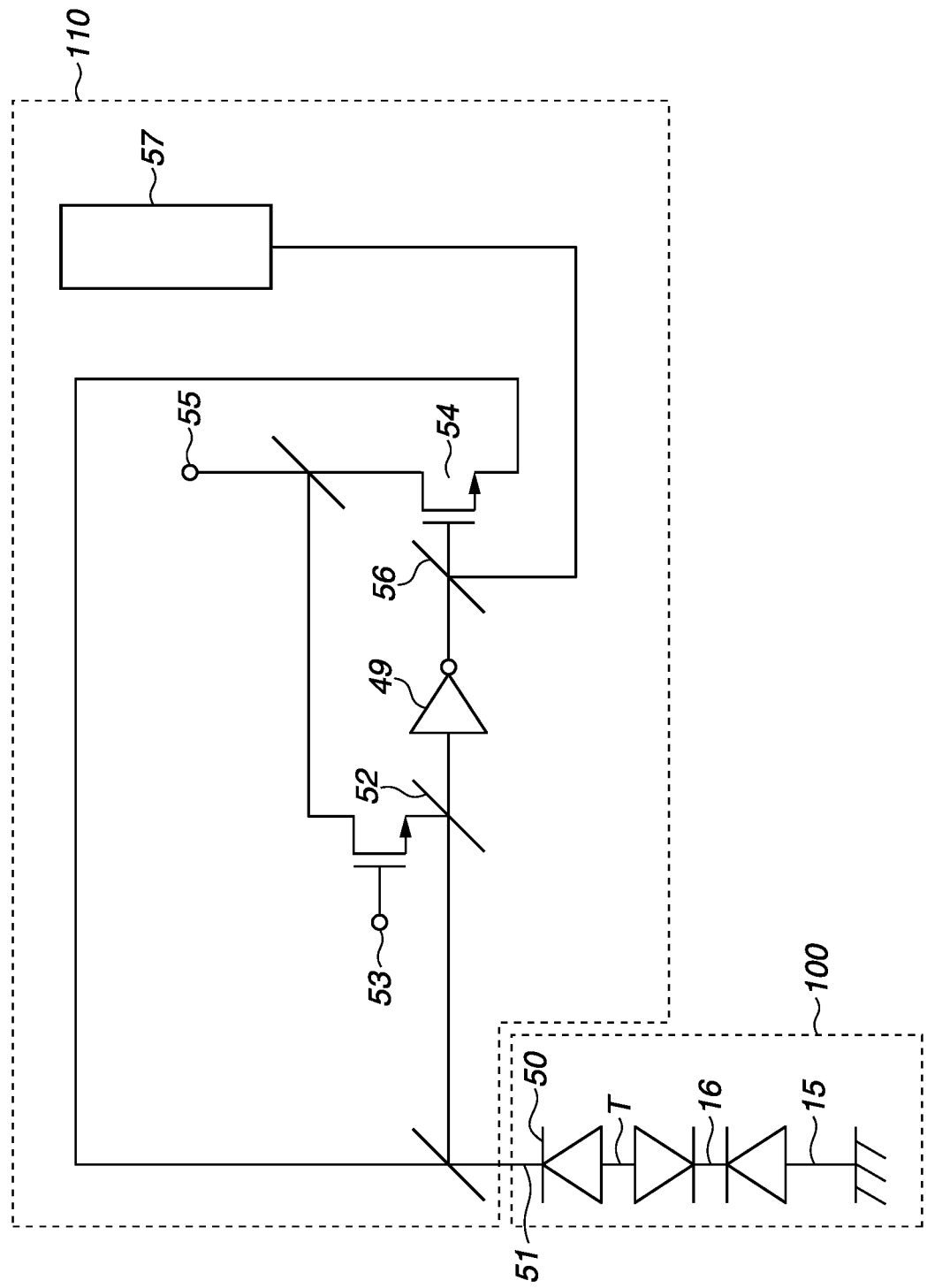
FIG. 21 is a readout circuit diagram of a pixel in the fourth exemplary embodiment.

FIG. 21 is a circuit diagram illustrating a readout circuit which receives an output from the OFD 50 via the wiring 51. Furthermore, while, in this circuit diagram, the portion T is illustrated as a P-type semiconductor region, the portion T does not need to be a P-type semiconductor region but only needs to act as a potential barrier with respect to electrons.

As illustrated in FIG. 21, the OFD 50 is arranged in the first semiconductor substrate 100, and the readout circuit is arranged in the second semiconductor substrate 110. The wiring 51 is electrically connected to a wiring formed in the second semiconductor substrate 110.

The readout circuit includes an inverter 49 electrically connected to the OFD 50, an output terminal 56 of the inverter 49, a terminal 55, a transistor 52, which resets the OFD 50 to the potential of the terminal 55, a transistor 54 connected to the terminal 56, the terminal 55, and the OFD 50, and a digital counter 57 connected to the terminal 56. A fixed potential is supplied to the terminal 55.

In the following description, readout from at least one pixel arranged in one row is described.

In the fourth exemplary embodiment, a readout circuit connected to the cathode 13 is the same as that in the first exemplary embodiment, and is, therefore, omitted from description here.

Figure 22:
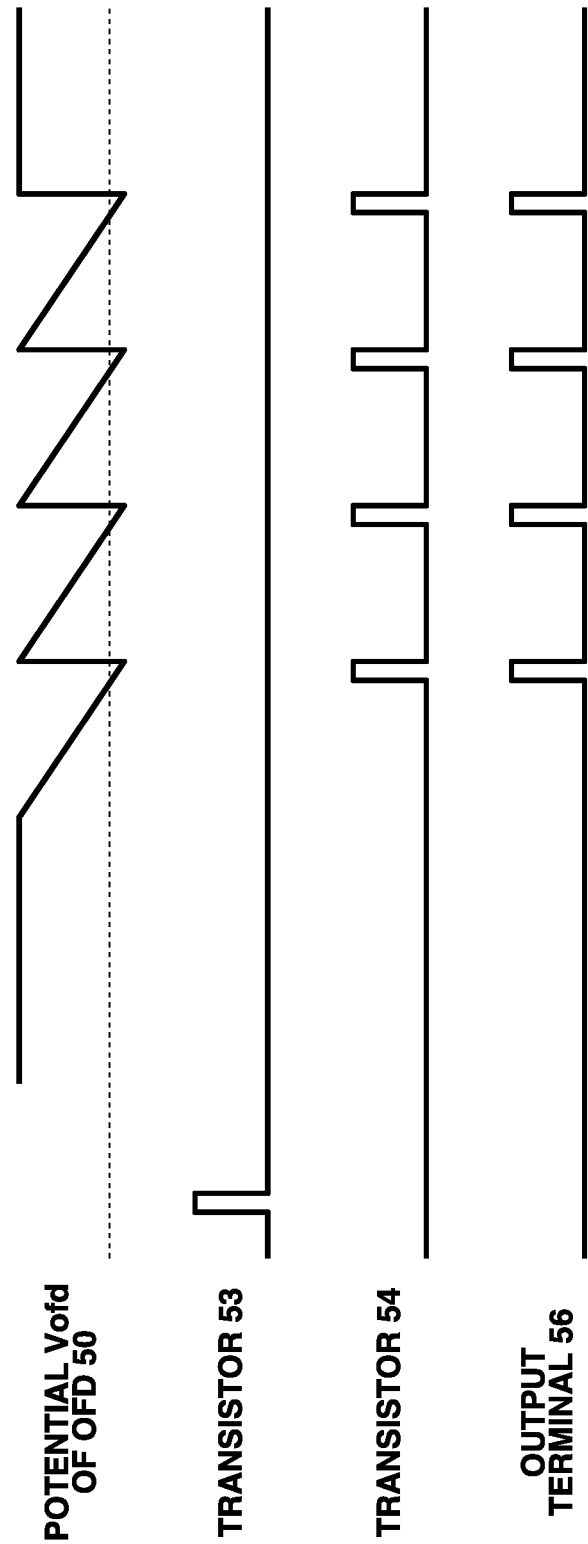
FIG. 22 is a signal readout operation timing chart in a pixel in the fourth exemplary embodiment.

FIG. 22 is a timing chart illustrating drive pulses in readout of a signal from the OFD 50 and changes in potential of respective portions. Readout from the OFD 50 is the second readout, which does not cause avalanche multiplication to occur. The second readout circuit operates when a signal charge which has overflowed from the N-type semiconductor region 16 has exceeded a predetermined amount.

First, when the input terminal 53 becomes at high level, the MOS transistor 52 is turned on, so that the potential Vofd of the OFD 50 becomes a reset potential corresponding to the potential of the terminal 55. At this time, the potential of the terminal 56 is at low level. Next, when light falls on the PD 1, a signal charge is accumulated in the N-type semiconductor region 16. When light further falls on the PD 1, a signal charge which has exceeded the saturation charge amount of the N-type semiconductor region 16 overflows to the OFD 50. In the OFD 50, accumulation of a signal charge is started, and the potential Vofd of the OFD 50 decreases according to the amount of a signal charge accumulated in the OFD 50. When the potential of the OFD 50 falls below a predetermined amount, the inverter 49 operates, so that the output of the terminal 56 becomes at high level. With this, the transistor 54 is turned on, so that the potential of the OFD 50 is reset to the potential of the terminal 55. As a result of being reset, the potential of the terminal 56 becomes at low level again. In this way, one pulse is output to the terminal 56. As long as light falls on the PD 1 and accumulation of a signal charge in the N-type semiconductor region 16 is repeated, the above-mentioned pulse output is repeated.

The digital counter 57 counts the number of pulses output to the terminal 56. The counted number is able to be converted into the amount of incident light by being multiplied by a predetermined charge amount. A charge amount per one pulse is determined by the capacity of the OFD 50, a reset voltage produced by the MOS transistor 54, and a threshold value of the inverter 49. For example, one count is equivalent to 1,000 photons.

In the fourth exemplary embodiment, when the amount of a signal charge which has overflowed from the PD 1 becomes a predetermined amount or more, the readout circuit operates and recording is thus performed on the counter 57. Thus, signals with an amount larger than or equal to the saturation charge amount of the N-type semiconductor region 16 become able to be recorded.

According to the fourth exemplary embodiment, a photoelectric conversion device with a low power consumption equivalent to a CMOS sensor, a high S/N ratio equivalent to SPAD, and a larger dynamic range can be implemented.

Figure 23:
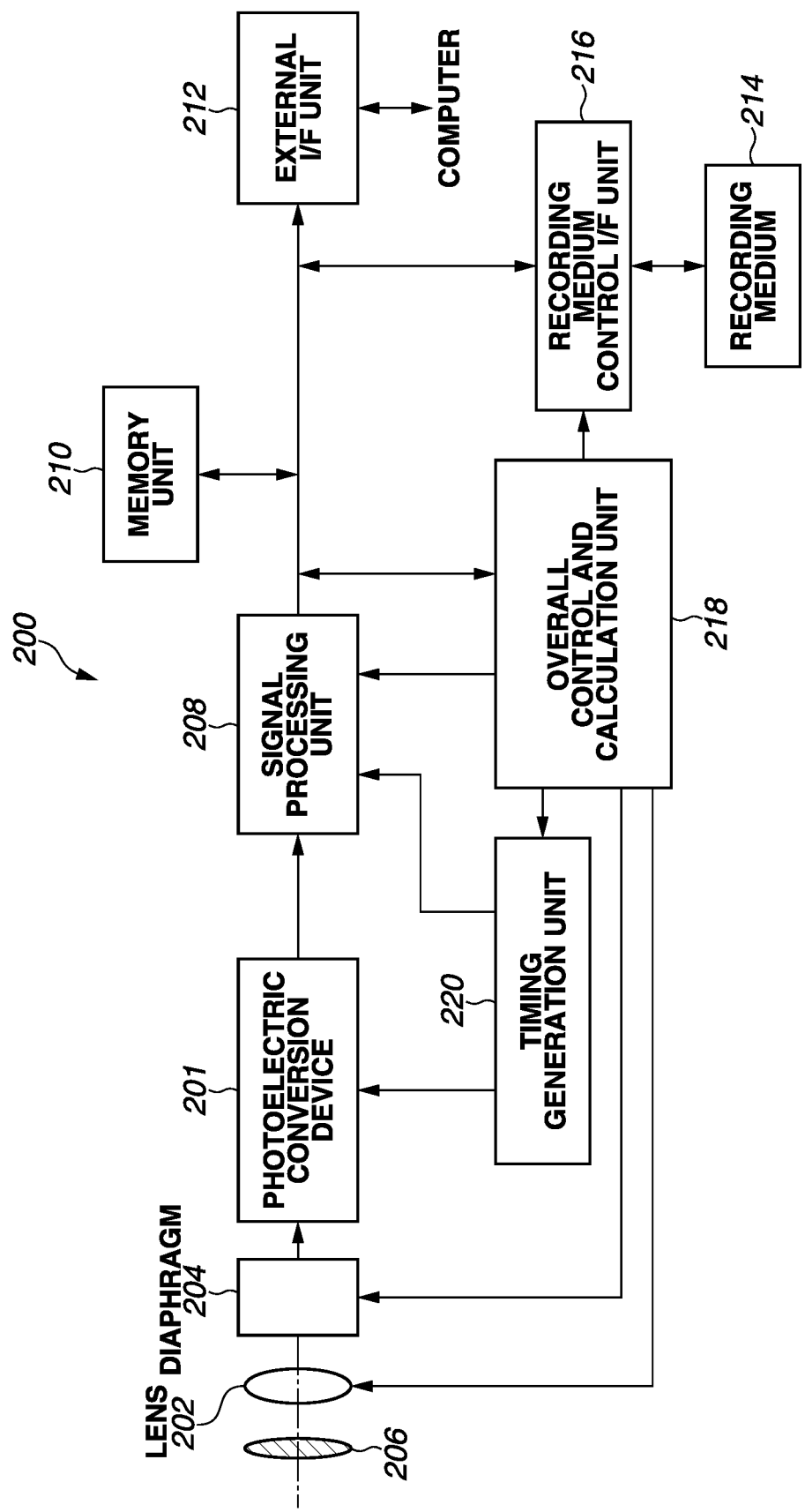
FIG. 23 is a block diagram illustrating a schematic configuration of a photoelectric conversion system in a fifth exemplary embodiment.

A photoelectric conversion system according to a fifth exemplary embodiment is described with reference to FIG. 23. Constituent elements similar to those of the photoelectric conversion devices described in the above-described exemplary embodiments are assigned the respective same reference characters, and description thereof is omitted or simplified. FIG. 23 is a block diagram illustrating a schematic configuration of the photoelectric conversion system according to the fifth exemplary embodiment.

The photoelectric conversion device described in each of the above-described exemplary embodiments can be applied, as a photoelectric conversion device 201 illustrated in FIG. 23, to various types of photoelectric conversion systems. Example of such applicable photoelectric conversion systems include a digital still camera, a digital camcorder, a monitoring camera, a copying machine, a facsimile apparatus, a mobile phone, a vehicle-mounted camera, and an observation satellite. Moreover, a camera module including an optical system such as a lens and a photoelectric conversion device is also included in the photoelectric conversion system. FIG. 23 illustrates a block diagram of a digital still camera as one of such examples.

A photoelectric conversion system 200 illustrated in FIG. 23 as an example includes a photoelectric conversion device 201, a lens 202, which focuses an optical image of a subject on the photoelectric conversion device 201, a diaphragm 204, which varies the amount of light passing through the lens 202, and a barrier 206, which protects the lens 202. The lens 202 and the diaphragm 204 constitute an optical system which collects light onto the photoelectric conversion device 201. The photoelectric conversion device 201 is a photoelectric conversion device described in each of the first to fourth exemplary embodiments, and converts an optical image formed by the lens 202 into image data.

The photoelectric conversion system 200 further includes a signal processing unit 208, which performs processing on an output signal output from the photoelectric conversion device 201. The signal processing unit 208 performs AD conversion for converting an analog signal output from the photoelectric conversion device 201 into a digital signal. Moreover, the signal processing unit 208 performs an operation for performing various correction and compression operations on the input signal as appropriate and then outputting the processed image data. An AD conversion unit which is a part of the signal processing unit 208 can be formed in a semiconductor substrate in which the photoelectric conversion device 201 is provided, or can be formed in a semiconductor substrate different from the semiconductor substrate in which the photoelectric conversion device 201 is provided. Moreover, the photoelectric conversion device 201 and the signal processing unit 208 can be formed in the same semiconductor substrate.

The photoelectric conversion system 200 further includes a memory unit 210, which temporarily stores image data, and an external interface unit (external I/F unit) 212, which performs communication with, for example, an external computer. Moreover, the photoelectric conversion system 200 further includes a recording medium 214, such as a semiconductor memory, which is used to record or read out captured image data, and a recording medium control interface unit (recording medium control I/F unit) 216, which is used to perform recording or reading-out on the recording medium 214. Furthermore, the recording medium 214 can be incorporated in the photoelectric conversion system 200 or can be configured to be attachable to and detachable from the photoelectric conversion system 200.

Additionally, the photoelectric conversion system 200 further includes an overall control and calculation unit 218, which not only performs various calculations but also controls the entire digital still camera, and a timing generation unit 220, which outputs various timing signals to the photoelectric conversion device 201 and the signal processing unit 208. Here, the timing signals can be input from an outside source, and the photoelectric conversion system 200 only needs to include at least the photoelectric conversion device 201 and the signal processing unit 208, which processes an output signal output from the photoelectric conversion device 201.

The photoelectric conversion device 201 outputs a captured image signal to the signal processing unit 208. The signal processing unit 208 performs predetermined processing on the captured image signal output from the photoelectric conversion device 201 and then outputs image data. Moreover, the signal processing unit 208 generates an image using the captured image signal.

With the photoelectric conversion device described in each of the above-described exemplary embodiments applied, a photoelectric conversion system capable of stably acquiring a good-quality image with a large saturation signal amount at a high sensitivity can be implemented.

A photoelectric conversion system and a moving body according to a sixth exemplary embodiment are described with reference to FIGS. 24A and 24B.

FIG. 24A illustrates an example of a photoelectric conversion system, which is associated with a vehicle-mounted camera. The photoelectric conversion system 300 includes a photoelectric conversion device 310. The photoelectric conversion device 310 is any one of the photoelectric conversion devices described in the above-described first to fourth exemplary embodiments. The photoelectric conversion system 300 further includes an image processing unit 312, which performs image processing on a plurality of pieces of image data acquired by the photoelectric conversion device 310, and a parallax calculation unit 314, which calculates parallax (a phase difference between parallax images) from a plurality of pieces of image data acquired by the photoelectric conversion system 300. Moreover, the photoelectric conversion system 300 further includes a distance measurement unit 316, which calculates a distance from the photoelectric conversion system 300 to a target object based on the calculated parallax, and a collision determination unit 318, which determines whether there is a collision possibility based on the calculated distance. Here, the parallax calculation unit 314 or the distance measurement unit 316 is an example of a distance information acquisition unit configured to acquire distance information indicating a distance from the photoelectric conversion system 300 to a target object. Thus, the distance information is information concerning, for example, parallax, the amount of defocus, or a distance to a target object. The collision determination unit 318 can determine a collision possibility using any one of these pieces of distance information. The distance information acquisition unit can be implemented by hardware designed for exclusive use or can be implemented by a software module. Moreover, the distance information acquisition unit can be implemented by, for example, a field programmable gate array (FPGA) or an application specific integrated circuit (ASIC), or can be implemented by a combination of these.

The photoelectric conversion system 300 is connected to a vehicle information acquisition device 320 and is thus able to acquire vehicle information, such as vehicle speed, yaw rate, and steering angle. Moreover, the photoelectric conversion system 300 is connected to a control electronic control unit (ECU) 330, which is a control device for outputting a control signal to generate braking force on a vehicle based on a result of determination by the collision determination unit 318. Moreover, the photoelectric conversion system 300 is also connected to an alarm device 340, which alarms a driver based on a result of determination by the collision determination unit 318. For example, in a case where the collision possibility is high as a result of determination by the collision determination unit 318, the control ECU 330 performs vehicle control to avoid a collision and reduce damage by, for example, applying the brakes, returning an accelerator pedal, or reducing engine output. The alarm device 340 issues a warning to a user by, for example, sounding an alarm such as sound, displaying alarm information on a screen of, for example, a car navigation system, or applying a vibration to a shoulder harness or a steering wheel.

In the sixth exemplary embodiment, the photoelectric conversion system 300 captures an image of the surroundings of a vehicle, such as a view in front of or behind the vehicle. FIG. 24B illustrates the photoelectric conversion system 300, which is used to capture an image of the view in front of the vehicle (an image capturing range 350). The vehicle information acquisition device 320 issues an instruction to cause the photoelectric conversion system 300 or the photoelectric conversion device 310 to perform a predetermined operation. This configuration enables further improving the accuracy of distance measurement.

While, in the above description, the present exemplary embodiment is applied to an example of a control operation for preventing collision with another vehicle, the present exemplary embodiment is also applicable to, for example, a control operation for performing automated driving to follow another vehicle or a control operation for performing automated driving to keep the lane. Moreover, the photoelectric conversion system can be applied to not only a vehicle such as a car but also a moving object (a moving apparatus), such as a ship, an airplane, or an industrial robot. Additionally, the photoelectric conversion system can be applied to not only the moving object but also an equipment which widely uses object recognition, such as an intelligent transport system (ITS).

Modified Exemplary Embodiments

The present disclosure is not limited to the above-described exemplary embodiments but can be modified in various manners. For example, an example in which some constituent elements of any one of the exemplary embodiments are added to another exemplary embodiment and an example in which such constituent elements are replaced by some constituent elements of another exemplary embodiment are also exemplary embodiments of the present disclosure.

Furthermore, the above-described exemplary embodiments merely illustrate specific examples for implementing the present disclosure, and these examples should not be construed to limit the technical scope of the present disclosure. In other words, the present disclosure can be implemented in various modes without departing from the technical idea of the present disclosure or the primary features thereof Thus, photoelectric conversion devices capable of improving image quality can be attained.

While the present disclosure has been described with reference to exemplary embodiments, it is to be understood that the disclosure is not limited to the disclosed exemplary embodiments. The scope of the following claims is to be accorded the broadest interpretation so as to encompass all such modifications and equivalent structures and functions.

What is claimed is:

1. A photoelectric conversion device comprising:
a photoelectric conversion region including a first semiconductor region having a first conductivity type, and configured to generate a signal charge;
a second semiconductor region having a second conductivity type;
a third semiconductor region having the first conductivity type, to which the signal charge is transferred from the first semiconductor region; and
a charge accumulation region including a fourth semiconductor region having the first conductivity type, to which the signal charge is transferred from the first semiconductor region,
wherein a first potential barrier having a potential higher than a potential of the first semiconductor region between the first semiconductor region and the third semiconductor region,
wherein a second potential barrier having a potential higher than the potential of the first semiconductor region between the first semiconductor region and the fourth semiconductor region,
wherein the signal charge is transferred from the first semiconductor region to the third semiconductor region by controlling a height of the first potential barrier,
wherein, in at least a part of a period in which the signal charge is transferred from the first semiconductor region to the third semiconductor region, a reverse bias voltage for causing avalanche multiplication caused by the signal charge to occur is applied to between the second semiconductor region and the third semiconductor region, and
wherein first readout for reading out a signal that is based on the signal charge via the third semiconductor region and second readout for reading out the signal that is based on the signal charge via the fourth semiconductor region are able to be performed.

2. The photoelectric conversion device according to claim 1, wherein the first readout is performed with respect to a first portion of the signal charge generated at the photoelectric conversion region during a predetermined period, and the second readout is performed with respect to a second portion of the signal charge generated at the photoelectric conversion region during the predetermined period.

3. The photoelectric conversion device according to claim 1, wherein the first readout is performed with respect to all of the signal charge generated at the photoelectric conversion region during a first period, and the second readout is performed with respect to all of the signal charge generated at the photoelectric conversion region during a second period different from the first period.

4. The photoelectric conversion device according to claim 3, wherein whether to perform the first readout or whether to perform the second readout is selectable according to switching of modes.

5. The photoelectric conversion device according to claim 1, wherein whether to perform the first readout or whether to perform the second readout is selected according to an amount of the signal charge generated at the photoelectric conversion region.

6. The photoelectric conversion device according to claim 5, wherein, in a case where the amount of the signal charge generated at the photoelectric conversion region is smaller than a predetermined amount, the first readout is performed with respect to all of the signal charge.

7. The photoelectric conversion device according to claim 6, wherein the predetermined amount is a saturation charge amount of the photoelectric conversion region.

8. The photoelectric conversion device according to claim 1, wherein the third semiconductor region is lower in impurity concentration than the fourth semiconductor region.

9. The photoelectric conversion device according to claim 1, wherein the height of the first potential barrier is higher than a height of the second potential barrier.

10. The photoelectric conversion device according to claim 1, further comprising a fifth semiconductor region of the first conductivity type,
wherein the signal charge transferred to the fourth semiconductor region is transferred to the fifth semiconductor region and is then read out.

11. The photoelectric conversion device according to claim 10, wherein a gate electrode is arranged between the fourth semiconductor region and the fifth semiconductor region in planar view, and
wherein transfer of the signal charge from the fourth semiconductor region to the fifth semiconductor region is performed by a potential supplied to the gate electrode being changed.

12. The photoelectric conversion device according to claim 10, further comprising:
a source-follower transistor connected to the fifth semiconductor region;, and
a sixth semiconductor region of the second conductivity type which configures a PN junction with the fourth semiconductor region,
wherein each of a power-supply voltage for the source-follower transistor and a reverse bias voltage which is applied to between the fourth semiconductor region and the sixth semiconductor region is smaller than the reverse bias voltage which is applied to between the second semiconductor region and the third semiconductor region when the signal charge is transferred to the third semiconductor region.

13. The photoelectric conversion device according to claim 1, further comprising an AD conversion unit configured to perform analog-to-digital conversion on an analog signal read out by the second readout.

14. The photoelectric conversion device according to claim 1, further comprising a counting circuit configured to count a number of occurrences of avalanche current which is caused to occur by avalanche multiplication in the first readout.

15. The photoelectric conversion device according to claim 14, wherein addition processing for adding a first count value obtained by the counting circuit and a second count value obtained by the AD conversion unit configured to perform analog-to-digital conversion on an analog signal read out by the second readout is performed.

16. The photoelectric conversion device according to claim 15, wherein, in the addition processing, a conversion gain of the first count value and a conversion gain of the second count value are same.

17. The photoelectric conversion device according to claim 15, wherein, in the addition processing, a correction that is based on a difference in conversion gain is performed on at least one of the first count value and the second count value.

18. The photoelectric conversion device according to claim 17, wherein the correction is a value obtained by dividing a source-follower-based output signal voltage by a source-follower output portion per one signal charge.

19. A photoelectric conversion system comprising:
the photoelectric conversion device according to claim 1; and
a signal processing unit configured to process a signal output from the photoelectric conversion device.

20. A moving body comprising:
the photoelectric conversion device according to claim 1;
a distance information acquisition unit configured to acquire distance information indicating a distance from the moving body to a target object from a signal output from the photoelectric conversion device; and
a control unit configured to control the moving body based on the distance information.

21. The photoelectric conversion device according to claim 1, further comprising a circuit for outputting a pulse signal based on the signal that is based on the signal charge via the third semiconductor region in the first readout.

22. The photoelectric conversion device according to claim 21, further comprising a counting circuit configured to count a number of occurrences of avalanche current which is caused to occur by avalanche multiplication from the circuit for outputting the pulse signal in the first readout.

* * * * *